US008729466B1

(12) United States Patent
Mankos

(10) Patent No.: US 8,729,466 B1
(45) Date of Patent: May 20, 2014

(54) ABERRATION-CORRECTED AND ENERGY-FILTERED LOW ENERGY ELECTRON MICROSCOPE WITH MONOCHROMATIC DUAL BEAM ILLUMINATION

(71) Applicant: Marian Mankos, Palo Alto, CA (US)

(72) Inventor: Marian Mankos, Palo Alto, CA (US)

(73) Assignee: Electron Optica, Inc., Palo Alto, CA (US)

( * ) Notice: Subject to any disclaimer, the term of this patent is extended or adjusted under 35 U.S.C. 154(b) by 0 days.

(21) Appl. No.: 13/804,066

(22) Filed: Mar. 14, 2013

(51) Int. Cl.
H01J 37/05 (2006.01)
G01N 23/225 (2006.01)
H01J 37/29 (2006.01)
H01J 37/153 (2006.01)

(52) U.S. Cl.
CPC ............... *H01J 37/05* (2013.01); *H01J 37/29* (2013.01); *H01J 37/153* (2013.01)
USPC .............. 250/305; 250/492.3; 250/492.22; 250/492.23; 250/396 R; 250/396 ML

(58) Field of Classification Search
CPC ........... H01J 37/05; H01J 37/26; H01J 37/29; H01J 37/026; H01J 37/153; H01J 37/141; H01J 37/147; H01J 37/1472; H01J 37/252; G01N 23/225; G21K 1/093
See application file for complete search history.

(56) References Cited

U.S. PATENT DOCUMENTS 5,319,207 A 6/1994 Rose et al.
6,310,341 B1* 10/2001 Todokoro et al. ............. 250/305
6,803,571 B1* 10/2004 Mankos et al. ............... 850/9
6,803,572 B2* 10/2004 Veneklasen et al. .......... 850/9

(Continued)

*Primary Examiner* — David A Vanore

(57) ABSTRACT

One embodiment relates to an apparatus for correcting aberrations introduced when an electron lens forms an image of a specimen and simultaneously forming an electron image using electrons with a narrow range of electron energies from an electron beam with a wide range of energies. A first electron beam source is configured to generate a lower energy electron beam, and a second electron beam source is configured to generate a higher energy electron beam. The higher energy beam is passed through a monochromator comprising an energy-dispersive beam separator, an electron mirror and a knife-edge plate that removes both the high and low energy tail from the propagating beam. Both the lower and higher energy electron beams are deflected by an energy-dispersive beam separator towards the specimen and form overlapping illuminating electron beams. An objective lens accelerates the electrons emitted or scattered by the sample. The electron beam leaving the specimen is deflected towards a first electron mirror by an energy-dispersive beam separator, which introduces an angular dispersion that disperses the electron beam according to its energy. A knife-edge plate, located between the beam separator and first electron mirror, is inserted that removes all of the beam with energy larger and smaller than a selected energy and filters the beam according to energy. One or more electron lenses focus the electron beam at the reflection surface of the first electron mirror so that after the reflection and another deflection by the same energy-dispersive beam separator the electron beam dispersion is removed. The dispersion-free and energy-filtered electron beam is then reflected in a second electron mirror which corrects one or more aberrations of the objective lens. After the second reflection, electrons are deflected by the magnetic beam separator towards the projection optics which forms a magnified, aberration-corrected, energy-filtered image on a viewing screen.

15 Claims, 13 Drawing Sheets

(56) References Cited

U.S. PATENT DOCUMENTS

| | | |
|---|---|---|
| 6,943,360 B1 * | 9/2005 | Mankos .................. 250/492.2 |
| 7,009,177 B1 * | 3/2006 | Mankos et al. ............. 250/310 |
| 7,022,987 B2 * | 4/2006 | Preikszas et al. ........... 250/310 |
| 7,217,924 B1 | 5/2007 | Mankos et al. |
| 7,348,566 B2 * | 3/2008 | Tromp .................... 250/396 R |
| 7,432,514 B2 * | 10/2008 | Tromp .................... 250/492.22 |
| 7,453,062 B2 * | 11/2008 | Tromp ...................... 250/305 |
| 7,838,832 B1 * | 11/2010 | Mankos et al. .............. 250/310 |
| 8,183,526 B1 * | 5/2012 | Mankos ...................... 250/305 |
| 8,258,474 B1 * | 9/2012 | Mankos ...................... 250/310 |
| 8,334,508 B1 * | 12/2012 | Mankos ...................... 250/305 |
| 2011/0068267 A1 * | 3/2011 | Hasegawa et al. ........... 250/310 |

\* cited by examiner

ABERRATION-CORRECTED AND ENERGY-FILTERED LOW ENERGY ELECTRON MICROSCOPE WITH MONOCHROMATIC DUAL BEAM ILLUMINATION

FEDERAL SUPPORT

This invention was made with Government support under Grant Number R43HG006303 from the National Human Genome Research Institute (NHGRI) awarded by the PHS. The Government has certain rights in the invention.

BACKGROUND OF THE INVENTION

1. Field of the Invention

The present invention relates generally to electron beam apparatus and electron microscopy methods.

2. Description of the Background Art

Optical microscopes, the simplest and most common instruments used to image objects too small for the naked eye to see, uses photons with visible wavelengths for imaging. A specimen is illuminated with a broad light beam, and a magnified image of the specimen can be observed using an eyepiece or camera. The maximum magnification of a light microscope can be more than 1000× with a diffraction-limited resolution limit of a few hundred nanometers. Improved spatial resolution in an optical microscope can be achieved when shorter wavelengths of light, such as ultraviolet wavelengths, are utilized for imaging.

An electron microscope is a different type of microscope. It uses electrons to illuminate the specimen and create a magnified image. The microscope has a greater resolving power than a light microscope, because it uses electrons that have wavelengths few orders of magnitude shorter than visible light. Electron microscopes can achieve magnifications exceeding 1,000,000×.

Scanning electron beam microscopes (SEMs), the most widely used electron microscopes, image the specimen surface by scanning it with a tightly focused high-energy beam of electrons in a raster scan pattern, pixel by pixel. In a typical SEM, an electron beam is emitted in a vacuum chamber from an electron gun equipped with a thermionic (tungsten, lanthanum hexaboride), thermally assisted (Schottky, zirconium oxide) or cold field emission cathode. The electron beam, which typically has an energy ranging from a few hundred eV to few tens keV, is collimated by one or more condenser lenses and then focused by the final objective lens to a spot about 1 nm to 100 nm in diameter. The beam is deflected by pairs of magnetic scanning coils or electrostatic deflector plates, sweeping in a raster fashion over a rectangular area of the specimen surface. Primary electrons can generate various signals from elastically scattered electrons, secondary electrons (due to inelastic scattering), characteristic Auger electrons and the emission of electromagnetic radiation. Each of the generated signals can be detected by specialized detectors, amplified and displayed on a CRT display or captured digitally, pixel by pixel on a computer.

Low energy emission microscopes (LEEM) and photoemission electron microscopes (PEEM) are projection (as opposed to scanning) electron microscopes, and thus resemble a conventional light microscope. In a LEEM, the electron gun forms a broad electron beam that is accelerated to typically 10 to 30 keV and passed through a beam separator, an energy-dispersive magnetic prism that separates the illumination and projection optics and bends the beam into the axis of a cathode objective lens containing the specimen. The objective lens is called a cathode lens as the specimen forms the negative electrode in this lens. A parallel flood beam then uniformly illuminates the specimen that is electrically biased at approximately the same potential as the cathode of the electron gun, so that illuminating electrons are decelerated in the objective lens, striking the specimen at energies typically between 0 to about 1000 eV. In the opposite direction, i.e. upward from the specimen, the objective lens simultaneously accelerates the scattered electrons and forms a magnified image of the specimen. As the electrons reenter the beam separator, they get deflected into the projection optics. The projection zoom optics forms an electron image on the scintillating screen that is then viewed by a CCD camera and further processed on a computer. The extremely low energy of the illuminating electrons makes LEEM an exquisitely sensitive surface imaging technique, capable of imaging single atomic layers with high contrast. The low landing energy of electrons is also critical for avoiding radiation damage, as high energy electrons in all keV kinetic energy ranges can cause unavoidable damage to many types of specimens.

Photoemission electron microscopes (PEEM) are projection electron microscopes, where the specimen is illuminated with UV photons or X-rays rather than electrons. Similar to a LEEM, the objective lens is a cathode lens with the specimen at a high negative bias. The photon flood beam uniformly illuminates the specimen, and the photoemitted electrons are accelerated by the objective lens and form a magnified image of the specimen.

One of the main drawbacks of conventional LEEM/PEEM is lateral resolution. In spite of the short deBroglie wavelength in the Angstrom range, the lateral resolution of conventional LEEM instruments is limited to a few nm and sub-nm resolution has not been achieved yet; and PEEM resolution ranges from 10 to 20 nm. The electron lenses used for imaging in a LEEM/PEEM, in particular the cathode objective lens, introduce spherical and chromatic aberrations that deteriorate the spatial resolution of a LEEM/PEEM. Effective means for improving the spatial resolution are therefore desirable if LEEM/PEEM instruments are to be used for imaging at higher spatial resolution.

Another drawback of a conventional LEEM/PEEM is its lack of energy-filtered imaging. The primary electrons scattered by the specimen produce electrons over a wide range of energies, from secondary electrons in the range of a few eV, to hundreds to thousands of eV for characteristic Auger electrons, and near the landing energy for elastically scattered electrons. X-ray photons result in the generation of photoemission electrons with a wide spectrum of energies, containing element-specific peaks that can be used to characterize the specimen. Electrons with different energies produce different image contrast and can provide comprehensive information about the specimen, including specimen topography, composition, crystalline structure as well as electrical and magnetic properties. In order to obtain detailed information about the chemical composition, interatomic bonding and local electronic states of non-periodic objects such as nanoparticles, interfaces, defects and macromolecules, an energy resolution of 0.1 eV or less is necessary to discern their characteristic electronic states. Effective means for selecting electrons emitted from the sample with a narrow range of energies for imaging as well as utilizing monochromatic illumination with an energy spread smaller than the desired energy resolution are therefore desirable for detailed characterization of specimens.

One approach to improve the spatial resolution and provide energy-filtering capability in a LEEM/PEEM is to use an aberration corrector based on an electron mirror, such as the one disclosed in U.S. Pat. No. 5,319,207, which is entitled "Imaging system for charged particles" and which issued Jun. 7, 1994 to inventors Harald Rose, Ralf Degenhardt and Dirk Preikszas. As shown in FIG. 1 a, this approach employs a dispersion-free magnetic beam separator and an electron mirror for aberration correction. The absence of energy dispersion after each deflection facilitates minimum combined aberrations between the energy dispersion and the chromatic and spherical aberrations of the electron mirror. However, this prior technique is disadvantageous in some aspects. The practical implementation of this approach is rather difficult, due to complexity of the magnetic beam separator. The dispersion-free beam separator is a rather complicated electron-optical element, consisting of a large number of coils with complex shapes that are difficult to construct and align. The machining, tight tolerances and assembly are challenging which makes tuning and alignment of the whole microscope difficult. In addition, the dispersion-free magnetic prism separator cannot be used for energy filtering, and an additional energy filter must be included in the projection optics which further complicates the microscope design, assembly and alignment.

Another approach to improve the spatial resolution and provide energy-filtering capability in a LEEM/PEEM is to use an aberration corrector based on an electron mirror, such as the one disclosed in U.S. Pat. No. 7,348,566, which is entitled "Aberration-correcting cathode lens microscopy instrument" and which issued Mar. 25, 2008 to inventor Rudolf Tromp. Unlike the prior technique disclosed in U.S. Pat. No. 5,319,207 that uses a complex dispersion-free beam separator, the apparatus and method disclosed in the U.S. Pat. No. 7,348,566 do not require the separator to be free of dispersion in order to achieve aberration correction. Instead, as shown in FIG. 1 b, it uses two dispersive magnetic beam separators of a practical design with simple square shaped coils that are much easier to machine, assemble and align. In addition, the technique disclosed in the U.S. Pat. No. 7,348, 566 does not require an additional energy filter to carry out energy-filtered imaging. However, this technique using two beam separators is disadvantageous in some aspects. The additional deflection that transports the beam into the projection optics introduces energy dispersion that generates additional combination aberrations, including image tilt and off-axis astigmatism which can affect the image quality when sub-nm resolution is needed. In addition, the two beam separators have to be identical to ensure that the dispersion and all combination aberrations of the first prism separator are cancelled by the second prism separator, which may be difficult to achieve practically.

Another approach to improve the spatial resolution and provide energy-filtering capability in a LEEM/PEEM is to use an aberration corrector based on an electron mirror, such as the one disclosed in U.S. patent application Ser. No. 13/251,266, which is entitled "Compact arrangement for aberration correction of electron lenses" and which was filed Oct. 2, 2011 by inventor Marian Mankos.

Unlike the prior technique using a dispersion-free magnetic beam separator discussed above in relation to FIG. 1a, the apparatus and method disclosed in U.S. patent application Ser. No. 13/251,266 does not necessarily require a complex dispersion-free beam separator in order to achieve aberration correction. Instead, it uses a single energy-dispersive magnetic beam separator with practical design and simple square shaped coils that are much easier to machine, assemble and align.

Unlike the prior technique disclosed by Tromp in U.S. Pat. No. 7,348,566 using two energy-dispersive magnetic beam separators and discussed above in relation to FIG. 1b, the apparatus and method disclosed in U.S. patent application Ser. No. 13/251,266 does not require the use of an additional magnetic beam separator to achieve aberration correction. The prior technique disclosed by Tromp in U.S. Pat. No. 7,348,566 may result in additional combination aberrations in the projection optics including image tilt and off-axis astigmatism which can affect the final image quality. In addition, small differences in the geometry and excitation between the two energy-dispersive magnetic beam separators may result in incomplete cancellation of the dispersion combination aberrations, which may prevent the aberration corrector from fully correcting the objective lens aberrations. Instead, as shown in FIG. 1 c, it uses one dispersive magnetic beam separator and two electron mirrors to achieve aberration correction. The specimen is illuminated with an electron, UV-photon or X-ray beam, and a magnetic beam separator deflects the electron beam emitted from the specimen and magnified by a cathode objective lens towards a first electron mirror. The magnetic beam separator introduces an angular dispersion that disperses the incoming electron beam according to its energy. An electron lens is configured to focus the dispersed electron beam at the reflection surface of a first electron mirror and introduce symmetry so that the reflected electron beam passes through the magnetic beam separator a second time and exits without energy dispersion. The electron beam then enters a second electron mirror that is configured to correct for one or more aberrations of the cathode objective lens and reflect the electron beam back into the magnetic beam separator. After a third deflection through the magnetic beam separator the electron beam is transported into the projection optics and magnified on a viewing screen.

Another important drawback of a conventional LEEM/PEEM is its lack of imaging capability for insulating samples. When a conventional LEEM instrument is used to image insulating specimens, the low landing energy exacerbates charging effects resulting in significantly reduced image quality. The imbalance between the arriving and leaving flux of electrons causes the surface to charge up, resulting in increased blur and distortions. In many cases, the built-up surface charge can rapidly discharge in an arc, resulting in specimen damage. On a homogeneous insulator surface, the charging can be suppressed by operating at a landing energy resulting in a net electron yield of 1. However, this approach restricts the landing energy and typically does not work when different insulating materials are present on the surface. Effective means for controlling local surface charging are therefore desirable if LEEM instruments are to be used for imaging of insulating samples. None of the above mentioned aberration correction inventions shown in FIG. 1 a-c have a provision to mitigate the charging effects.

One possible approach that can be used to solve the charging problem in a LEEM/PEEM is the dual illumination beam approach. In a LEEM with dual-beam illumination, two electron beams with different landing energies are used to mitigate the charging effect. The low-energy electron beam with landing energy near 0 eV is partially mirrored and partially absorbed, charging the surface negatively. The high-energy electron beam (~100 eV or more) emits secondary electrons with an electron yield that exceeds 1, charging the surface positively. However, when two beams with opposite charging characteristics, i.e. a low-energy mirror electron beam and a high-energy electron beam are superimposed on the specimen, charging effects can be neutralized. The challenge is to devise an electron optical system that can deliver overlapping illumination of the low-energy mirror and high-energy electron beams at preferably normal incidence on the specimen, i.e. a system that combines two parallel electron beams with different energies and beam currents at the specimen surface.

One approach to combine two illuminating electron beams with different charging characteristics to mitigate the deleterious charging effects is disclosed in U.S. Pat. No. 6,803,572, which is entitled "Apparatus and methods for secondary electron emission with a dual beam" and which issued Oct. 12, 2004 to inventors Lee H. Veneklasen and David L. Adler. As shown in FIG. 1 d, this approach employs two co-planar guns with different beam energies and inclined beam axes that generate two illumination beams. The guns are configured such that the angle of inclination is equal to the difference in bending angles caused by the magnetic prism separator. However, this prior technique is disadvantageous in some aspects. The practical implementation of this approach is rather difficult, due to the small difference in deflection angles. For example, for a 30 keV electron beam energy and beam energy differential of 300 eV, the difference in deflection angles amounts to only about 5 mrad, i.e. about ⅓ of a degree. This means that the guns must be impractically far from the prism in order not to overlap. In principle, one can increase the angular separation by biasing a drift tube in the beam separator at high negative potential and thus lowering the beam energy while electrons pass through the beam separator. However this is not desirable due to increased Coulomb interactions and geometric aberrations that deteriorate the spatial resolution. In addition, it complicates the design and increases the likelihood of high-voltage arcing.

Another approach to combine two illuminating electron beams with different charging characteristics to mitigate the deleterious charging effects is disclosed in U.S. Pat. No. 6,803,571, which is entitled "Method and Apparatus for Dual-Energy E-Beam Inspector" and which issued Oct. 12, 2004 to inventors Marian Mankos and David L. Adler, is shown in FIG. 1 e. Unlike the prior technique using two inclined beams discussed above, the apparatus and method disclosed in U.S. Pat. No. 6,803,571 do not necessarily require biasing of the separator at high voltage in order to achieve sufficient angular separation of the low and high energy beams. In addition, the presently disclosed technique does not require two electron guns to be in close proximity to each other. The apparatus includes a dual-beam electron gun that is configured to generate both a high-energy electron beam component and a low-energy electron beam component. In one implementation, the dual-beam electron gun is composed of two concentric cathodes, an inner disc and an outer annulus. The inner disc may be biased at a high negative voltage with respect to the specimen, while the outer annulus may be biased by an additional negative voltage with respect to the inner disc. However, this prior technique using a dual-beam electron gun is disadvantageous in some aspects. The proximity of the two cathodes in the gun at different temperatures and potentials results in complex crosstalk effects, beam current drift and long settling times, which makes it difficult for practical use and may reduce stability and reliability of the electron beam apparatus. These issues can be resolved when an electron mirror and prism are used to recombine two spatially separate electron beams.

Another approach to combine two illuminating electron beams with different charging characteristics to mitigate the deleterious charging effects is disclosed in U.S. Pat. No. 7,217,924, which is entitled "Holey mirror arrangement for dual-energy e-beam inspector" and which issued May 15, 2007 to inventors Marian Mankos and Eric Munro. As shown in FIG. 1 f, the apparatus includes a illumination configuration with two perpendicular branches which are connected by a magnetic prism beam combiner. The first branch includes a first electron gun at a first (lower) energy, and the second branch includes a second electron gun or source at a second potential energy. The second branch also includes a semitransparent electron mirror that reflects the lower energy beam and transmits the higher energy beam. This prior technique allows the use of two conventional single beam guns, which simplifies the gun design and makes the operation more reliable. However, this prior technique is disadvantageous in some aspects. The column requires an additional bending element, i.e. a magnetic prism array, and complex transfer optics to assure cancellation of the dispersion.

Another approach to combine two illuminating electron beams with different charging characteristics to mitigate the deleterious charging effects is disclosed in U.S. Pat. No. 8,258,474, which is entitled "Compact arrangement for dual-beam low energy electron microscope" and which issued Sep. 4, 2012 to inventor Marian Mankos. As shown in FIG. 1 g, a first electron beam source is configured to generate a low-energy electron beam, and an energy-dispersive device deflects the low-energy electron beam towards an Einzel lens that acts as an semitransparent electron mirror. The Einzel lens is biased to reflect the low-energy electron beam. A second electron beam source is configured to generate a high-energy electron beam that passes through an opening in the Einzel lens. Both the low- and high-energy electron beams enter the same energy-dispersive device that deflects both beams towards the specimen. A deflection system positioned between the high-energy electron source and Einzel lens is configured to deflect the high-energy electron beam by an angle that compensates for the difference in bending angles between the lower- and higher energy electron beams introduced by the energy-dispersive device, therein allowing both the lower- and high-energy beams to strike the specimen at normal incidence.

However, none of the above-mentioned prior dual-beam beam approaches allow for aberration correction, monochromatic illumination and energy filtered imaging. In addition, none of the above-mentioned aberration-correction and energy-filtering approaches allow for dual beam illumination. An improved LEEM/PEEM apparatus and methods for providing simultaneous aberration correction, monochromatic illumination, energy filtering and dual beam illumination are desirable.

SUMMARY

One embodiment pertains to an apparatus for generating an aberration-corrected, energy-filtered image of a specimen illuminated by two spatially overlapping electron beams. A first electron beam source is configured to generate a high-energy electron beam, and passed through a monochromator utilizing an electron mirror and a knife-edge plate that removes the high and low energy tail from the propagating beam. A second electron beam source is configured to generate a low-energy electron beam, and a first energy-dispersive beam separator deflects the low-energy electron beam towards an electrostatic lens. The electrostatic lens is biased negatively to reflect the low-energy electron beam. The monochromatic high-energy beam passes through the negatively biased electrostatic lens. Both the low- and high-energy electron beams enter the first energy-dispersive beam separator that deflects both beams towards a transfer electron lens. The transfer electron lens is configured to focus the dispersed electron beams at the achromatic plane of a second energy-dispersive beam separator and introduce symmetry so that after the deflection by second energy-dispersive beam separator towards the cathode objective lens, both electron beams become coaxial. The cathode objective lens is configured to illuminate the specimen, and electrons scattered and emitted by the specimen form an electron beam with a range of energies. The scattered and emitted electrons return to the second energy-dispersive beam separator and are deflected towards a first electron mirror. The second energy-dispersive beam separator introduces an angular dispersion that disperses the incoming electron beam according to its energy. A knife-edge plate removes the electrons with energies higher and lower than the selected energy for imaging. An electron lens is configured to focus the electron beam into an electron mirror so that the electrons are reflected symmetrically. This assures that the energy dispersion is removed after the energy-filtered electron beam is deflected by the second energy-dispersive beam separator toward a second electron mirror. The second electron mirror is configured to correct for one or more aberrations of the cathode objective lens and reflects the electron beam back into the second energy-dispersive beam separator. After a third deflection through the second energy-dispersive beam separator the electron beam is transported with dispersion through the electron transfer lens towards the first energy-dispersive beam separator. The first energy-dispersive beam separator then deflects the energy-filtered electron beam into the projection optics. This deflection removes the energy dispersion and the energy-filtered electron beam forms an aberration-corrected, energy-filtered image that is magnified on a viewing screen.

Another embodiment pertains to a method for aberration correction and energy filtering when a cathode objective lens is used to image a specimen illuminated by electron beams with different energies. A high-energy electron beam, passed through a monochromator, and a low-energy electron beam illuminate a specimen and a cathode objective lens forms an image with electrons scattered and emitted by the specimen. The beam of electrons scattered and emitted by the specimen is deflected with energy dispersion towards a first electron mirror. A knife-edge plate removes both the high or low energy tail from the electron beam. The dispersed electron beam is focused by an electron lens at the reflection surface of the first electron mirror and reflected back. After a second deflection the energy dispersion is cancelled and the beam enters a second electron mirror. One or more aberrations of the image formed by the dispersion-free electron beam are corrected by the second electron mirror. The electron beam is deflected into the projection optics and magnified on a viewing screen.

Another embodiment pertains to an apparatus for generating an aberration-corrected, energy-filtered image of a specimen illuminated by spatially overlapping electron and UV or X-ray photon beams. A first electron beam source is configured to generate an electron beam. When a monochromatic electron beam is needed, a monochromator utilizing an electron mirror and a knife-edge plate is used to remove the high or low energy tail from the propagating electron beam. Both the electron and UV or X-ray photon beams are configured to illuminate the specimen, and electrons scattered and photoemitted by the specimen form an electron beam with a range of energies. The scattered and emitted electrons are deflected by a first energy-dispersive beam separator towards a first electron mirror. The energy-dispersive beam separator introduces an angular dispersion that disperses the incoming electron beam according to its energy. A knife-edge plate removes the electrons with energies higher and lower than the selected energy for imaging. An electron lens is configured to focus the electron beam into an electron mirror so that the electrons are reflected symmetrically. This assures that the energy dispersion is removed after the energy-filtered electron beam is deflected by the second energy-dispersive beam separator toward a second electron mirror. The second electron mirror is configured to correct for one or more aberrations of the cathode objective lens and reflects the electron beam back into the second energy-dispersive beam separator. After a third deflection through the second energy-dispersive beam separator the electron beam is transported with dispersion through the electron transfer lens towards the first energy-dispersive beam separator. The first energy-dispersive beam separator then deflects the energy-filtered electron beam into the projection optics. This deflection removes the energy dispersion and the energy-filtered electron beam forms an aberration-corrected, energy-filtered image that is magnified on a viewing screen.

Another embodiment pertains to a method for aberration correction and energy filtering when a cathode objective lens is used to image a specimen illuminated with an overlapping electron and UV or X-ray photon beam. The cathode objective lens forms an image with scattered or photoemitted electrons, and the beam of electrons scattered and emitted by the specimen is deflected with energy dispersion towards a first electron mirror. A knife-edge plate removes the electrons with energies higher and lower than the selected energy for imaging. The dispersed electron beam is focused by an electron lens at the reflection plane of the first electron mirror and reflected back so that the electron beam after a second deflection exits without energy dispersion. One or more aberrations of the image formed by the dispersion-free electron beam are corrected by a second electron mirror. The electron beam is deflected into the projection optics and magnified on a viewing screen.

Other embodiments are also disclosed.

DETAILED DESCRIPTION

An Aberration-Corrected, Energy-Filtered, Dual Beam LEEM/PEEM

While some of the above discussed prior apparatus and methods provide aberration correction and energy filtering, they do not allow for dual beam illumination. Other discussed prior apparatus and methods provide for dual beam illumination, however they do not allow for aberration correction, monochromatic illumination and energy filtered imaging. Improved apparatus and methods for providing aberration correction, energy filtering and dual beam illumination in a single LEEM/PEEM instrument are desirable. One distinct technique for providing aberration-corrected imaging, energy filtering and dual electron beam illumination with a monochromator in a single apparatus is disclosed herein and discussed below.

Figure 1A:
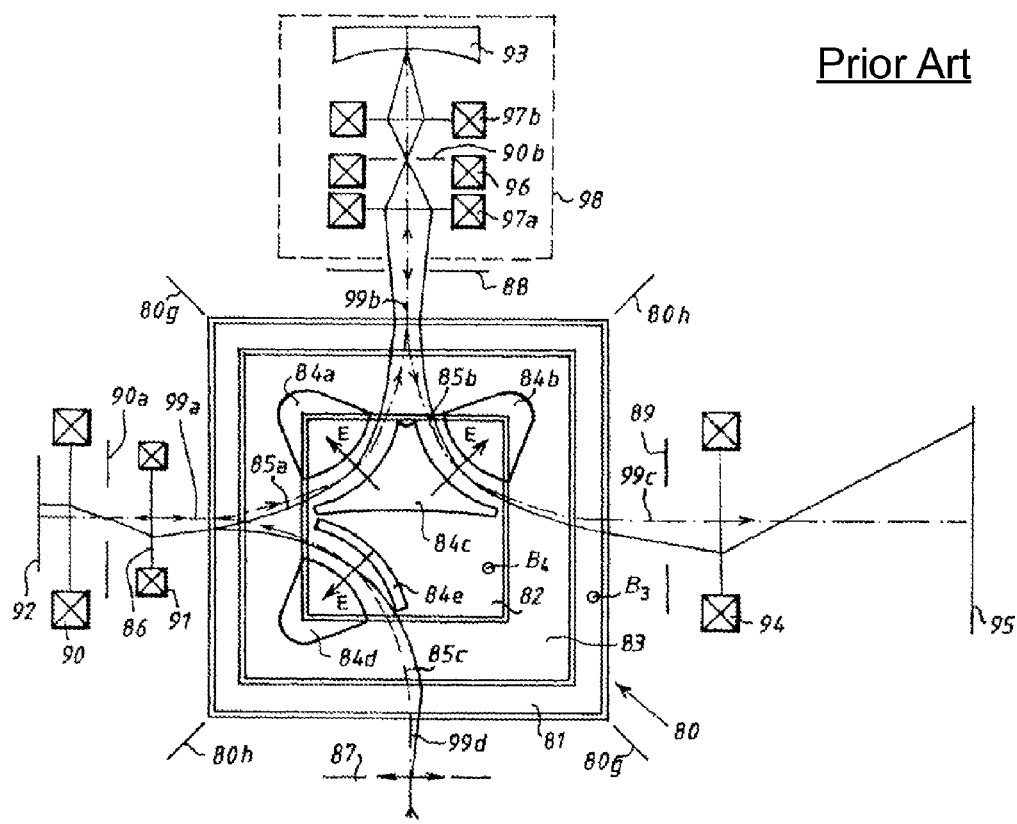
FIG. 1a is a diagram depicting a first prior structure for an electron beam apparatus having an aberration corrector and energy filter.

Unlike the prior technique of Rose et al. (FIG. 1a) employing a dispersion-free magnetic beam separator and an electron mirror for aberration correction, the presently disclosed apparatus and method does not require the separator to be free of dispersion in order to achieve aberration correction. In addition, the presently disclosed technique provides dual electron beam illumination which mitigates charging effects on insulating specimens, as well as monochromatic illumination, which further improves the spatial resolution as well as spectroscopic resolution for energy-filtered imaging.

Figure 1B:
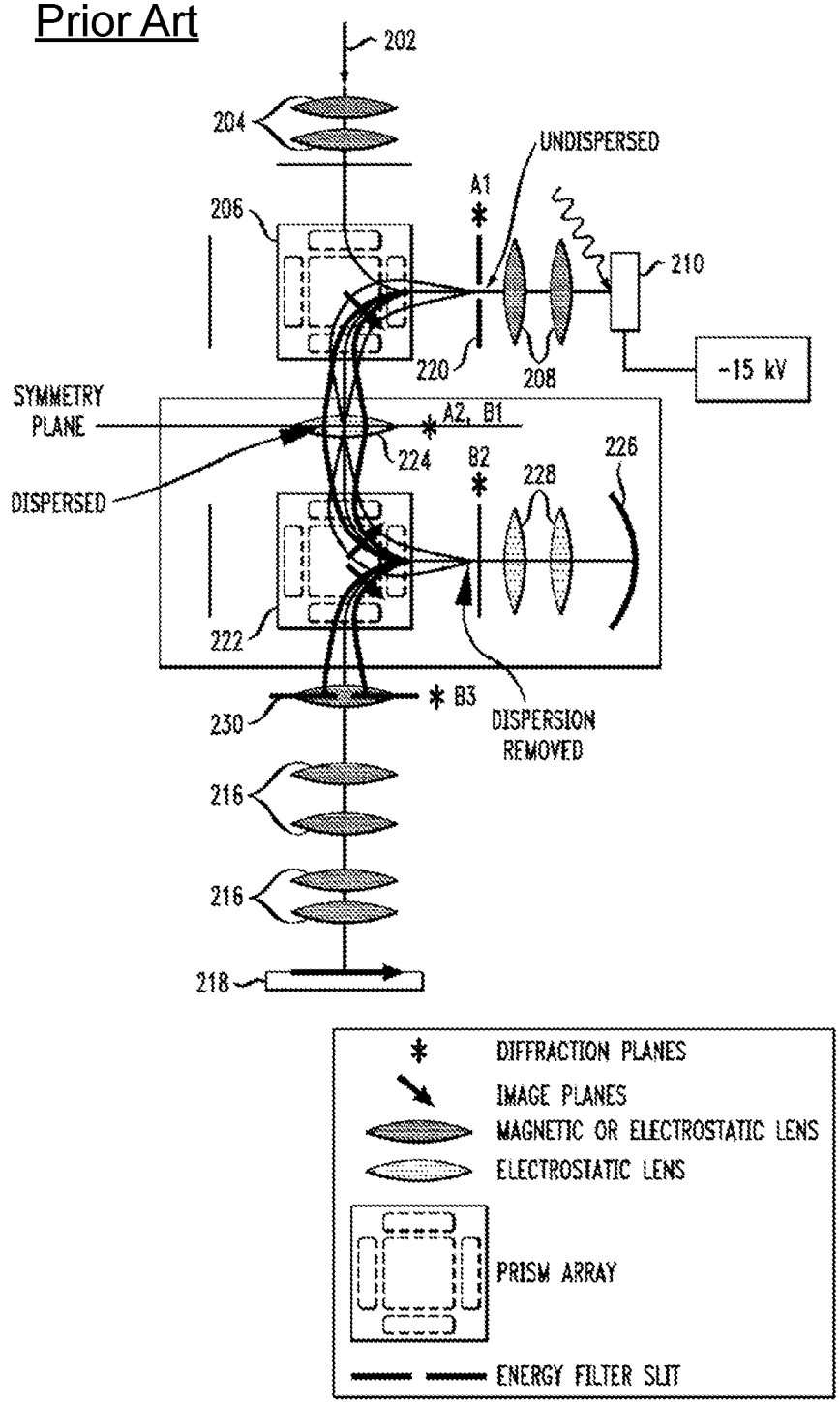
FIG. 1b is a diagram depicting a second prior structure for an electron beam apparatus having an aberration corrector and energy filter.

Unlike the prior technique of Tromp (FIG. 1b) using two dispersive magnetic beam separators for aberration correction, the presently disclosed apparatus and method does not generate additional combination aberrations including image tilt and off-axis astigmatism in the projection optics which can affect the image quality when sub-nm resolution is needed. In addition, the presently disclosed apparatus and method does not require two identical beam separators to ensure that the dispersion and all combination aberrations of the first beam separator are cancelled by the second beam separator. Further, it provides dual electron beam illumination which mitigates charging effects on insulating specimens, as well as monochromatic illumination, which improves the spatial resolution as well as the spectroscopic resolution for energy-filtered imaging.

Figure 1C:
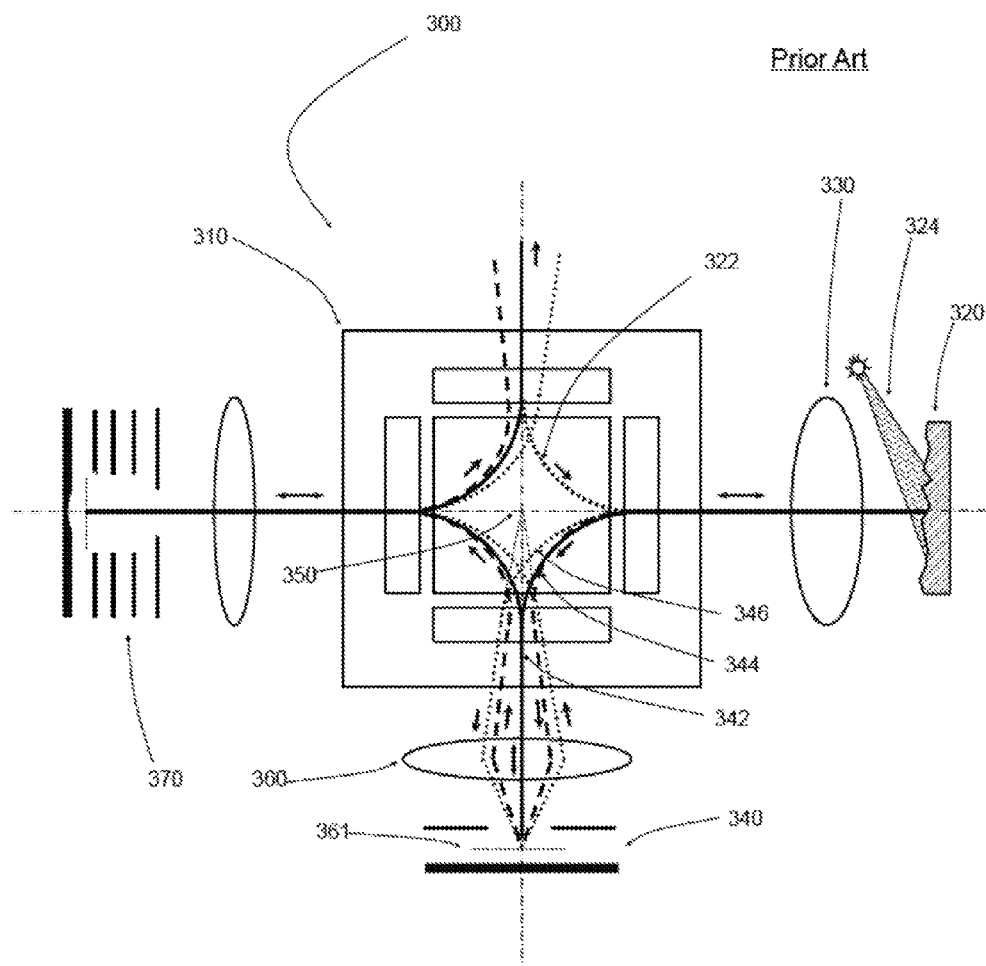
FIG. 1c is a diagram depicting a third prior structure for an electron beam apparatus having an aberration corrector.

Unlike the prior technique of Mankos (2011, U.S. patent application Ser. No. 13/251,266, FIG. 1c) using one dispersive magnetic beam separator and two electron mirrors for aberration correction, the presently disclosed apparatus and method provides dual electron beam illumination which mitigates charging effects on insulating specimens, as well as monochromatic illumination, which improves the spatial resolution as well as the spectroscopic resolution for energy-filtered imaging.

Figure 1D:
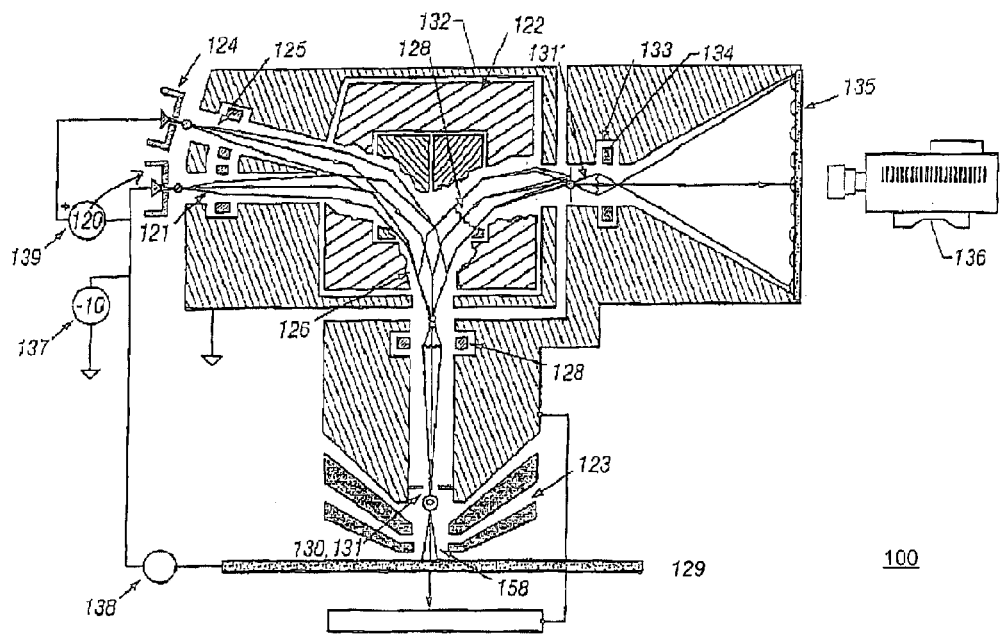
FIG. 1d is a diagram depicting a first prior structure for an electron beam apparatus having two illuminating beams.
Figure 1E:
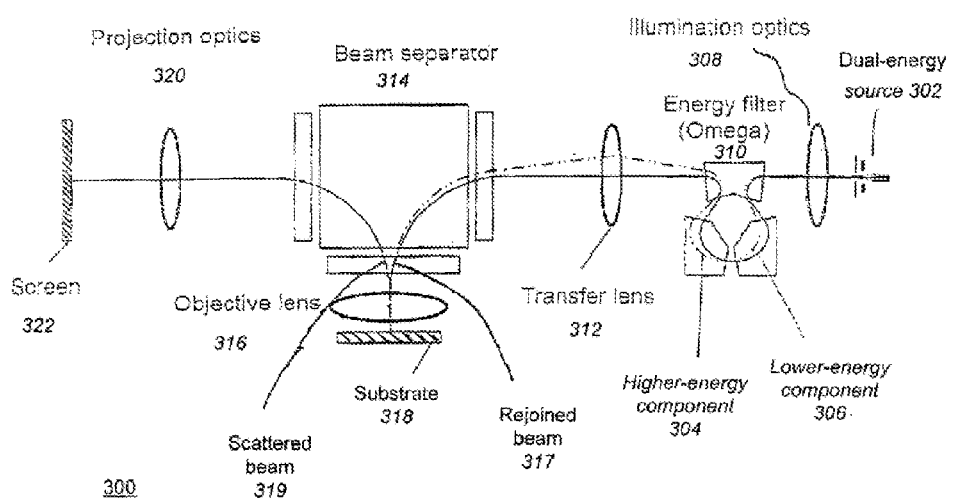
FIG. 1e is a diagram depicting a second prior structure for an electron beam apparatus having two illuminating beams.
Figure 1F:
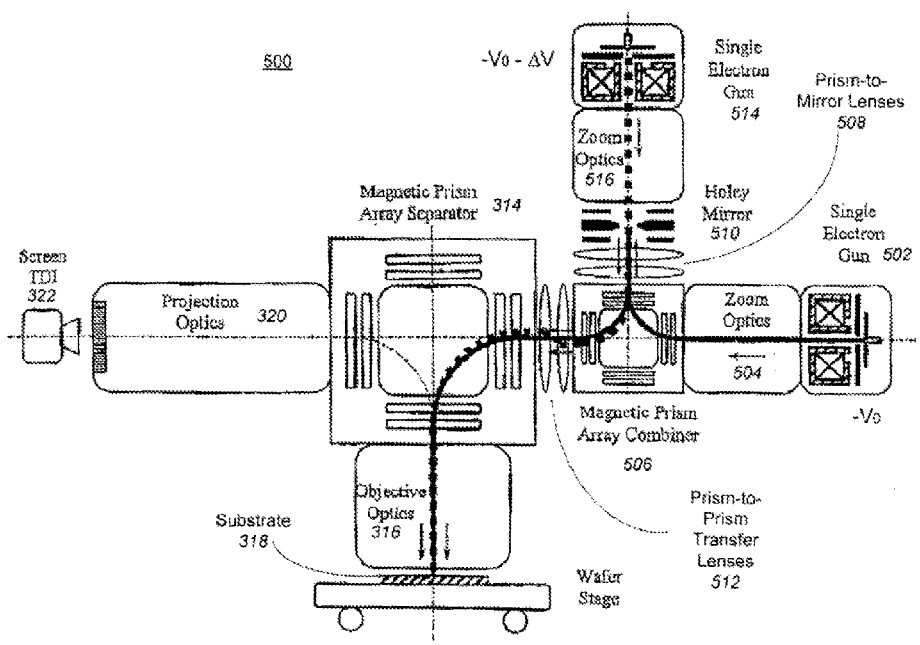
FIG. 1f is a diagram depicting a third prior structure for an electron beam apparatus having two illuminating beams.
Figure 1G:
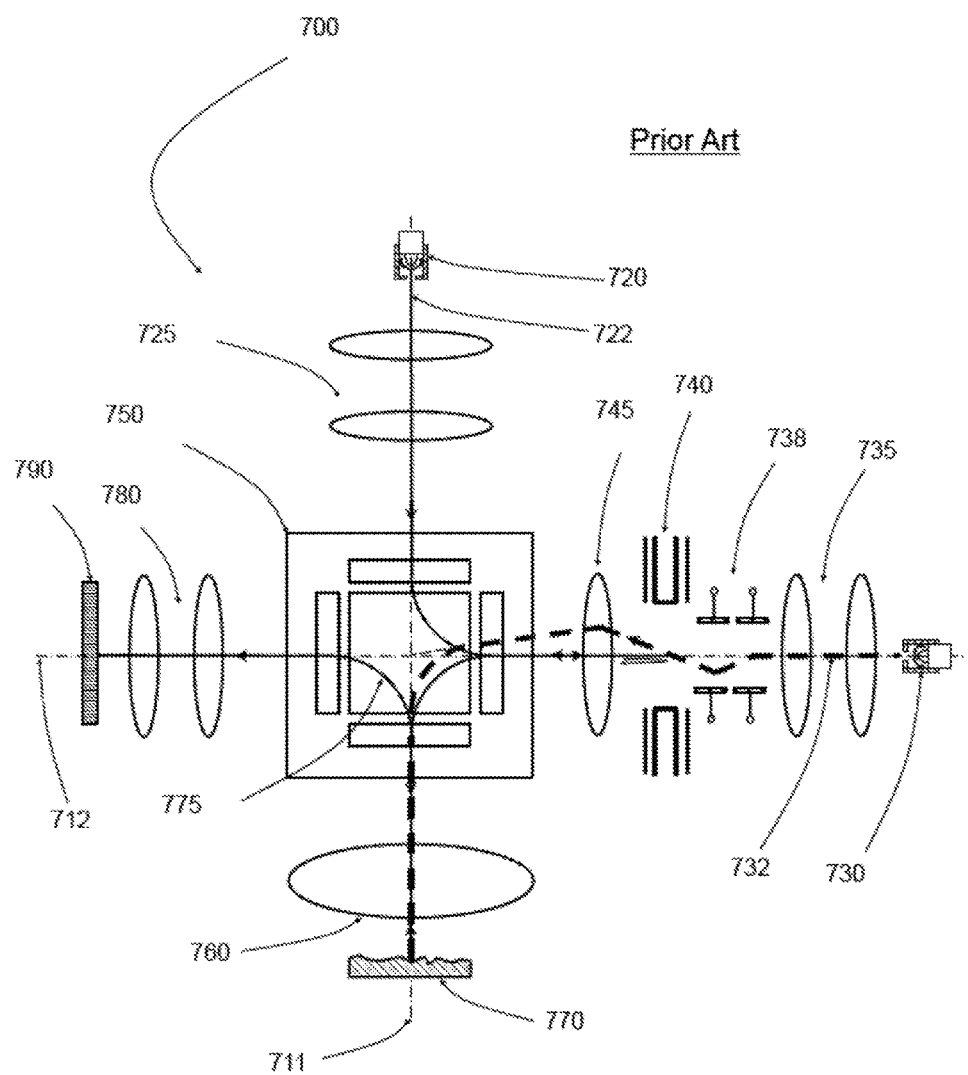
FIG. 1g is a diagram depicting a fourth prior structure for an electron beam apparatus having two illuminating beams.

Unlike the prior dual beam illumination techniques of Veneklasen and Adler (FIG. 1d), Mankos and Adler (FIG. 1e), Mankos and Munro (FIG. 1f), and Mankos (2012, U.S. Pat. No. 8,258,474, FIG. 1g), the presently disclosed apparatus and method provides aberration correction, which significantly improves obtainable spatial resolution, and energy filtering with monochromatic illumination, which further improves the spatial resolution as well as spectroscopic resolution for energy-filtered imaging.

Figure 2:
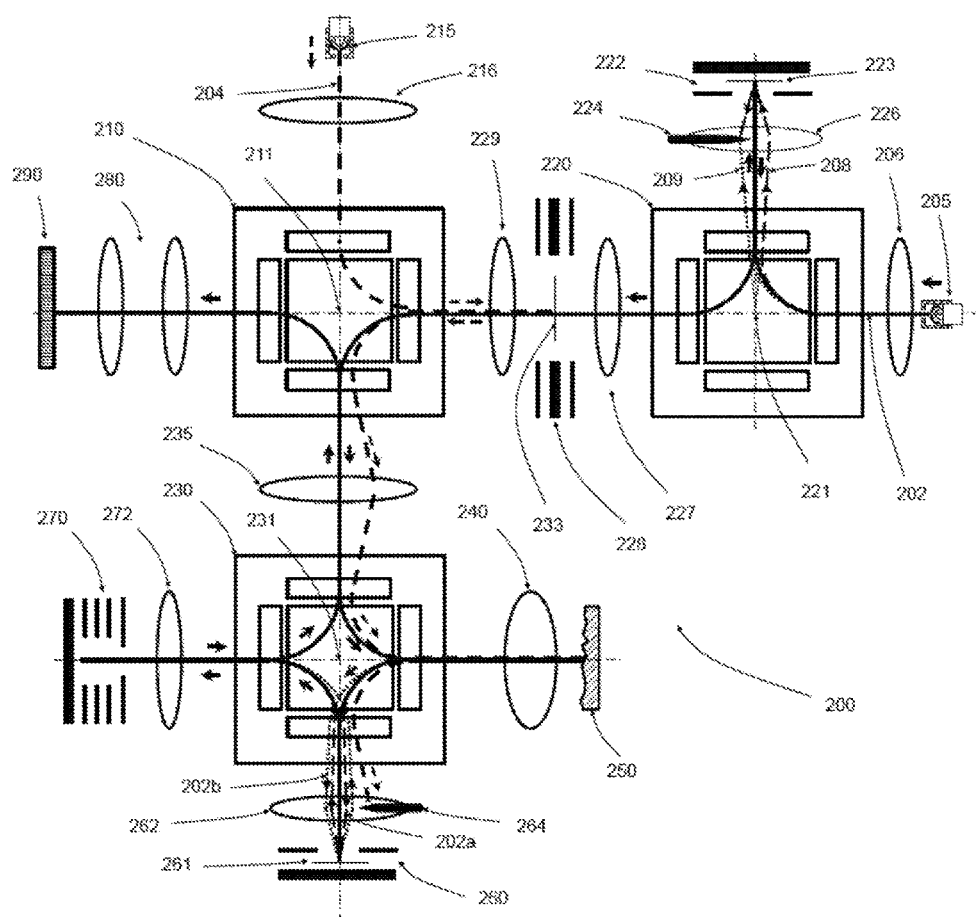
FIG. 2 is a diagram depicting a structure for a low energy electron microscope having an aberration corrector, energy filter, monochromator and two illuminating electrons beams in accordance with an embodiment of the invention.

A schematic layout of a LEEM/PEEM apparatus 200, combining two independent illumination beams with an aberration corrector, energy filter and monochromator, is shown in FIG. 2. Such an apparatus 200 may be used to improve the spatial and spectroscopic resolution of LEEM/PEEM microscopes and to allow imaging insulating or composite (metal, semiconductor, insulator) specimens that otherwise charge up during electron beam illumination.

The illumination configuration of FIG. 2 has two branches, one for an imaging beam 202 (solid lines) and one for a charge balance beam 204 (dash lines), which are recombined by the main beam separator 210, an energy dispersive element composed of an array of uniform magnetic fields of different length and strength so as to provide a mechanism for deflection and stigmatic focusing. The beam separators used here have a practical and proven design with rectangularly shaped coils. It is easy to manufacture and simplifies overall microscope alignment and tuning. Beam separator 210 simultaneously stigmatically images the incoming electron beam and deflects this beam by 90 degrees, i.e. the beam separator images as a conventional round lens while deflecting the incoming beam by 90 degrees, which greatly simplifies set-up, alignment and operation of the apparatus.

The illumination optics of the imaging beam 202 includes a second beam separator 220 that in combination with electron mirror 222 operates as a monochromator such as the one disclosed by M. Mankos in the U.S. Pat. No. 8,183,526, which is entitled "Mirror monochromator for charged particle beam apparatus" and issued on the $22^{nd}$ of May, 2012. The monochromator is designed to reduce the electron energy spread of the imaging beam 202 to less than 0.1 eV.

The energy spread of electron sources used commonly in LEEM instruments, e.g. thermionic (W, $LaB_6$) and thermally assisted (Schottky, $ZrO_2$) field emission cathodes, is in the range of 0.5 to 2 eV. The electron source 205, biased at high negative voltage, thus emits electrons with an energy spread $\Delta E$ of 0.5-2 eV. After the illumination optics 206, the beam passes through the beam separator 220, which deflects this beam into electron mirror 222. The electrons 202 with nominal beam energy $E_0$ (solid lines) are deflected by 90 degrees, while electrons 208 with slightly lower energy (long dash lines) are deflected by a slightly larger angle and electrons 209 with slightly higher energy (dotted lines) are deflected by a slightly smaller angle, due to the energy dispersion of prism separator 220. The axial bundle of rays with energies in the range ($E_0-\Delta E$, $E_0+\Delta E$) exiting beam separator 220 appears to emanate from a point near the center plane of the beam separator 220, also known as its achromatic point 221 (plane). As the electrons proceed towards electron mirror 222, a knife edge-shaped aperture 224 stops one portion of the energy distribution, e.g. the higher energy electrons 209 with energies $E_0+\Delta E$. The transfer optics 226 focuses the achromatic point 221 at the reflection surface 223 of electron mirror 222, which is biased to a slightly more negative potential than the electron source 205 by a few hundred V to a few kV, and thus reflects the electrons back into beam separator 220. As the remaining electrons proceed back to the beam separator, the lower energy electrons 208 with energies $E_0-\Delta E$ are stopped by the same knife edge-shaped aperture. This arrangement allows the use of a simple knife edge 224 as the energy-selecting device, which is a much simpler and more reliable design when compared to the narrow, often sub-micrometer slits needed in typical monochromator applications. The remaining nearly monochromatic electrons 202 then enter the beam separator 220 which deflects this beam by 90 degrees back into the axis of the electron source and towards the main beam separator 210. After the double pass through the monochromator formed by prism separator 220 and electron mirror 222 the dispersion of the monochromator vanishes due to the imposed mirror symmetry, which is desirable for high resolution imaging.

After exiting the beam separator 220, the nearly monochromatic imaging beam 202 passes through transfer optics 227 and Einzel lens 228, a three-electrode electrostatic lens with both outer electrodes at ground potential and the central electrode biased at a high negative potential. The nearly monochromatic imaging beam 202 then passes through transfer optics 229 and enters the main beam separator 210, which deflects this beam toward a third beam separator 230. After the 90 degree deflection by beam separator 230, the dispersion of imaging beam 202 introduced by the 90 degree deflection in beam separator 210 vanishes due to the imposed symmetry which is desirable for high resolution imaging.

The charge balance beam 204 generated by electron source 215, biased to a potential less negative by a few hundred volts than electron source 205, is used to mitigate charging effects. The illumination optics 216 collimate the charge balance beam 204 into the main beam separator 210, which deflects the beam by 90 degrees towards transfer optics 229 and Einzel lens 228. The fraction of charge balance beam electrons 204 with nominal beam energy $E_0$ are deflected by 90 degrees, while electrons with slightly lower energy are deflected by a slightly larger angle and electrons with slightly larger energy are deflected by a slightly smaller angle, due to the energy dispersion of prism separator 210. The axial bundle of electron rays with energies in the range ($E_0-\Delta E$, $E_0+\Delta E$) appears to emanate from a point near the center plane of the beam separator 210, the achromatic plane 211. Transfer optics 229 is configured to focus the achromatic plane at the reflection surface 233 of the Einzel lens 228. The reflection is caused by the central electrode of Einzel lens 228 which is biased slightly more negative than the electron source 215, and thus behaves like an electron mirror and reflects the charge balance beam electrons 204 back towards the beam separator 210. The Einzel lens 228 is configured to reflect the incoming electrons symmetrically, i.e. electrons entering at an angle with respect to the normal to the reflection surface 233 exit the Einzel lens 228 at the same angle and symmetrically with respect to the normal to the reflection surface 233. As the charge balance beam 204 proceeds back to the prism separator 210, the axial bundle of electron rays with energies in the range ($E_0-\Delta E$, $E_0+\Delta E$) is focused by transfer lens 229 back at the achromatic plane 211 of beam separator 210 and deflected towards third beam separator 230. The charge balance beam 204 has lower kinetic energy while passing through magnetic beam separator 210 when compared to imaging beam 202 and is thus deflected by a larger angle. Transfer lens 235 focuses charge balance beam 204 emanating from achromatic plane 211 of beam separator 210 at the achromatic plane 231 of beam separator 230. This ensures that after the next 90 degree deflection by beam separator 230, both imaging beam 202 and charge control beam 204 are again coaxial.

After the deflection by beam separator 210 and focusing by transfer lens 235, both beams are deflected by a third beam separator 230 that passes both beams through cathode objective lens 240. After the 90 degree deflection by beam separator 230 the dispersion of imaging beam 202 introduced by main beam separator 210 vanishes due to the imposed symmetry which is desirable for high resolution imaging. In objective lens 240 the electrons are decelerated from the transport beam energy of a few tens of keV and focused to form parallel flood beams illuminating a specimen 250. The electrons scattered and emitted by specimen 250 are accelerated and focused by objective lens 240 to form a magnified, two-dimensional image that is blurred by the aberrations of objective lens 240. The scattered and emitted electron beam then enter beam separator 230 and get deflected towards symmetry electron mirror 260. The strength of beam separator 230 is adjusted so that scattered imaging beam electrons 202 with nominal energy $E_0$ are deflected by 90 degrees and enter along the axis of electron mirror 260, while scattered electrons 202a (long dashed lines) with slightly lower energy $E_0-\delta E_1$ are deflected by a slightly larger angle and electrons 202b (dotted lines) with slightly larger energy $E_0+\delta E_2$ are deflected by a slightly smaller angle, due to the energy dispersion of beam separator 230. The axial bundle of electron rays with energies in the range ($E_0-\delta E_1$, $E_0+\delta E_2$) appears to emanate from a point near the center plane of beam separator 230, the achromatic plane 231. Transfer lens 262 is configured to focus the achromatic plane 231 at the reflection surface 261 of the electron mirror 260, which is biased more negative than specimen 250 by few hundred V to a few kV, and thus reflects the electron rays 202 back towards beam separator 230. The charge balance beam 204 has much lower kinetic energy while passing through magnetic beam separator 230 and is thus deflected by a larger angle and strikes knife edge aperture 264. The charge balance electrons 204 as well as any secondary electrons generated by the specimen can be stopped by a knife edge aperture 264 so as to not blur the image contrast formed by the scattered imaging beam 202. Knife edge aperture 264 in combination with beam separator 230 and electron mirror 260 selects electrons with nominal energy $E_0$ and thus operates as an imaging energy filter, such as the one described by M. Mankos in U.S. Pat. No. 8,334,508, which is entitled "Mirror energy filter for electron beam apparatus" and issued on the 18th of December, 2012. The nominal energy $E_0$ selected for imaging can be adjusted in the range from near 0 eV (charge balance electrons) to the electron landing energy (elastically backscattered electrons) by tuning the strength of beam separator 230. The width of the energy range (and thus the energy resolution of the final filtered image) can be selected by adjusting the position of knife edge aperture 264. This arrangement utilizes a simple knife-edge plate 264 as the energy selecting device, which is much simpler when compared to the narrow, often sub-micrometer slits needed in typical imaging energy filter applications. The mechanical design and manufacture of a knife-edge plate is much less complex when compared with a narrow slit aperture with straight and parallel edges and thus allows selection of a much narrower energy distribution. In this design, an energy width of 0.1 eV or less is achievable. In addition, the reliability of operation of a knife-edge plate under heavy electron bombardment is much improved when compared to slit apertures, as sub-micrometer slits tend to clog with electron-beam induced contamination.

Figure 3:
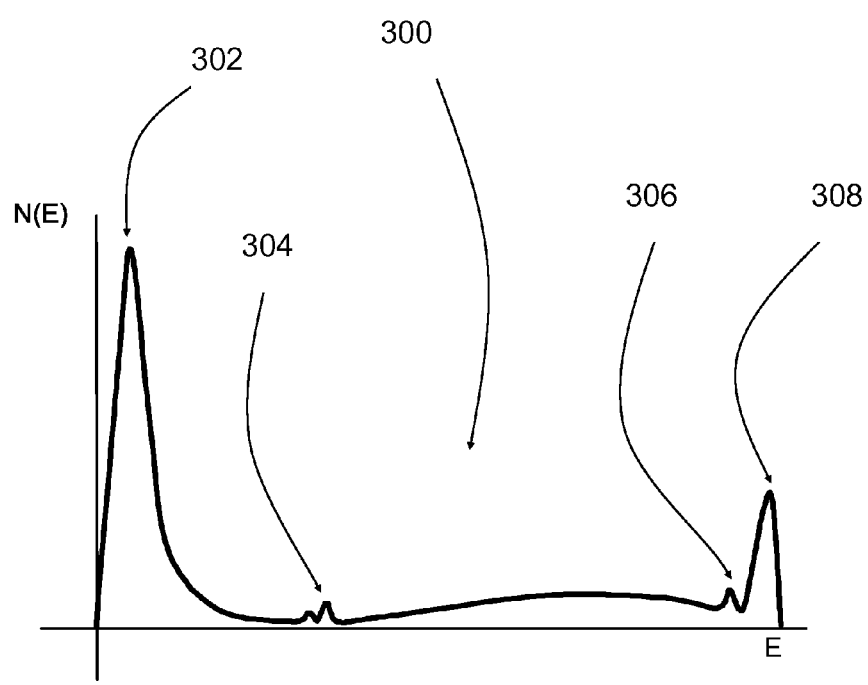
FIG. 3 is a diagram depicting the energy distribution of electrons scattered or emitted by the specimen.

The scattered electrons 202 include electrons with a range of energies. FIG. 3 depicts the energy distribution 300 of the scattered electron beam 202 leaving the specimen 250. The scattered electron beam 202 includes electrons emitted over a range of solid angles with energies ranging from near zero (secondary electrons 302) to the landing energy (elastically transmitted or backscattered electrons 308). Electrons with intermediate energies include Auger electrons 304 and also electrons that suffered plasmon losses 306. Each group of electrons can be used advantageously to form images of specimen 250 with different contrast by utilizing an energy filter which selects a narrow portion of the electron energy spectrum for imaging.

Coming back to FIG. 2, electron mirror 260 is configured to reflect the incoming electrons symmetrically, i.e. electrons entering at an angle with respect to the normal to the electron mirror reflection surface 261 exit the mirror at the same angle and symmetrically with respect to the normal to the electron mirror reflection surface 261 of electron mirror 260. Electron rays contained in scattered imaging beam 202 are refocused by transfer lens 262 at the achromatic plane 231 of magnetic beam separator 230 and deflected towards transfer lens 272 which focuses the scattered imaging beam 202 into second electron mirror 270 that is configured as an aberration corrector. After the second deflection by beam separator 230 the dispersion vanishes due to the imposed symmetry, which is a prerequisite for aberration correction. It is critical to remove the energy dispersion of the beam prior to entering electron mirror 270, as otherwise combination aberrations due to the dispersion of beam separator 230 and the chromatic and spherical aberrations of the electron mirror 270 are introduced that can be larger than the original aberrations and thus preclude the desired aberration correction.

Electron mirror 270 is configured to correct for one or more aberrations of cathode objective lens 240, and reflects the electron beam back towards beam separator 230. The aberration-corrected imaging beam 202 is refocused by transfer lens 272 at the achromatic plane 231 of beam separator 230 and deflected towards main beam separator 210. After a third 90 degree deflection through magnetic beam separator 230, aberration-corrected imaging beam 202 becomes again energy-dispersed. Transfer lens 235 focuses aberration-corrected imaging beam 202 emanating from achromatic plane 231 of beam separator 230 at the achromatic plane 211 of beam separator 210. This ensures that after the next 90 degree deflection by beam separator 210 the dispersion of aberration-corrected imaging beam 202 vanishes due to the imposed symmetry which is desirable for high resolution imaging in the projection optics 280.

After the final deflection by beam separator 210 the aberration-corrected imaging beam 202 exiting beam separator 210 is transported into the projection optics 280 and magnified on a viewing screen 290. The detection may be performed by a CCD camera detector or other detection system.

Figure 4:
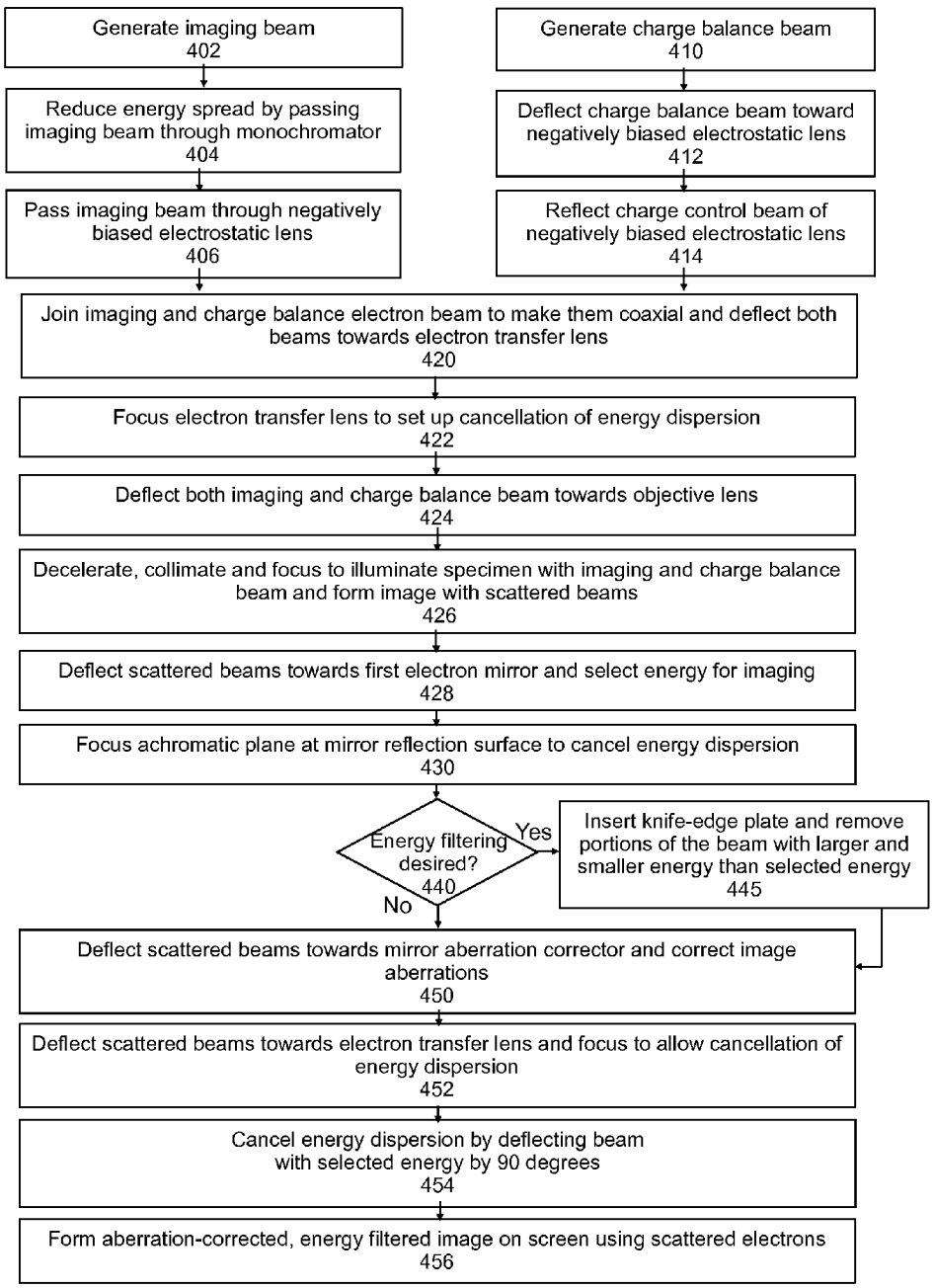
FIG. 4 is a flow chart depicting a method for imaging of a specimen using an aberration corrector, energy filter, monochromator and dual electron beam illumination in accordance with an embodiment of the invention.

FIG. 4 is a flow chart depicting a method 400 for imaging of a specimen using aberration correction, energy filtering, and dual beam illumination with a monochromator in accordance with an embodiment of the invention. This method 400 may use the structure 200 described above in relation to FIG. 2.

An imaging electron beam with nominal energy $E_0$ and energy width $\Delta E$ is generated 402 by a first electron gun. The energy spread of the imaging beam is reduced by passing it through a monochromator 404. After exiting the monochromator, the nearly monochromatic imaging beam passes through a negatively biased electrostatic lens 406, due to the fact that it has kinetic energy that is higher than the potential energy of the negative electrostatic lens.

A second, charge balance electron beam with a nominal energy a few hundred to a few thousand electron Volts lower than the imaging electron beam is generated 410 by a second electron gun. The charge balance electron beam is deflected 412 towards negatively biased electrostatic lens, and reflected 414 off negatively biased electrostatic lens due to the fact that it has kinetic energy that is smaller than the potential energy of the electrostatic lens.

The low- and high-energy components are joined to form coaxial electron beams and deflected 420 by a magnetic beam separator towards an electron transfer lens. During this deflection 420, energy dispersion is introduced in the two beam components. In other words, the two components are bent by different bending angles, due to the difference in electron energy. The transfer lens focuses 422 both electron beams emanating from the achromatic plane of first beam separator 210 into the achromatic plane of the next beam separator 230. This ensures that after the next 90 degree deflection by beam separator 230, both imaging beam 202 and charge balance beam 204 are again coaxial, i.e. the energy dispersion is cancelled.

The imaging and charge balance beam components are deflected 424 by a magnetic beam separator towards the objective lens and form coaxial electron beams. Using the objective lens, the imaging and charge balance beam components are decelerated, collimated and focused 426 to illuminate an area of the specimen. Impingement of the two electron beam components onto the specimen area generates scattered electron beams.

The scattered electron beams are bent 428 by a beam separator away from the illumination system and instead towards first electron mirror that in conjunction with the beam separator operates as an energy filter. The electron beam with energy $E_s$ selected for imaging is deflected by 90 degrees to introduce dispersion according to the electron energy. The beam separator deflects the high-energy component of the beam at less of an angle in comparison to its deflection of the low-energy component of the beam, such that the higher and lower energy electron-beam components exit the beam separator at different angles of trajectory. By adjusting the strength of one or more sectors in the beam separator, the selected electron energy $E_s$ can be tuned over a range of values covering the full range of the energy distribution of the scattered electron beam leaving the specimen.

One or more lenses are used to focus the achromatic plane of the beam separator, located near its center, at the reflection surface 430 of the electron mirror. The electron beams are reflected in this electron mirror symmetrically, i.e. electrons entering at an angle with respect to the normal to the electron mirror reflection surface exit the mirror at the same angle and symmetrically with respect to the normal to the electron mirror reflection surface. Due to the symmetry introduced by this electron mirror, the energy dispersion introduced by the previous 90 degree deflection is canceled by the dispersion introduced by the next 90 degree deflection.

When energy filtering is desired 440, a knife-edge plate is inserted 445 between the beam separator and electron mirror into the beam path which removes one portion of the beam (either the beam with energy larger than selected energy $E_s$ or with energy lower than selected energy $E_s$) during the path towards the electron mirror. The portion of the beam except the beam with selected energy $E_s$ is removed by the same knife-edge plate during the beam path from the electron mirror towards the beam separator. When energy filtering is not needed, the knife edge aperture is removed from the beam path.

The electron beam reflected by the electron mirror is then deflected 450 by 90 degrees into a mirror aberration corrector. Due to the symmetry introduced by the electron mirror, the energy dispersion introduced by second deflection 450 cancels the dispersion introduced by first deflection 428. The dispersion-free electron beam is then reflected in the second electron mirror which is configured to correct one or more aberrations of the objective lens.

After the reflection, electrons are directed towards the magnetic beam separator and deflected 452 by 90 degrees towards the electron transfer lens. During this deflection 420, energy dispersion is introduced in the electron beam. In other words, the beam components with different kinetic energies are bent by different bending angles, due to the difference in electron energy. The transfer lens is already focused 422 so that electron beams emanating from the achromatic plane of first beam separator 210 are focused into the achromatic plane of the next beam separator 230. This means that the transfer lens also focuses the electron beam emanating from the achromatic plane of beam separator 230 into the achromatic plane of the beam separator 210. Beam separator 210 deflects the electron beam by 90 degrees 454 towards the projection optics and introduces energy dispersion which cancels the energy dispersion due to the previous 90 degree beam deflection by beam separator 230. The projection optics forms 456 a magnified, aberration-corrected and (if elected) energy-filtered image on a viewing screen.

The above disclosed apparatus 200 combining two independent illumination beams with an aberration corrector, energy filter and monochromator, as shown in FIG. 2, can be advantageously operated in PEEM mode. The aberration corrector removes the spherical and chromatic aberrations that deteriorate the spatial resolution of conventional PEEM instruments, the energy filter allows for energy-selective imaging, and the charge balance beam allows investigation of insulating specimens, which otherwise charge up under UV or X-ray photon illumination.

Figure 5:
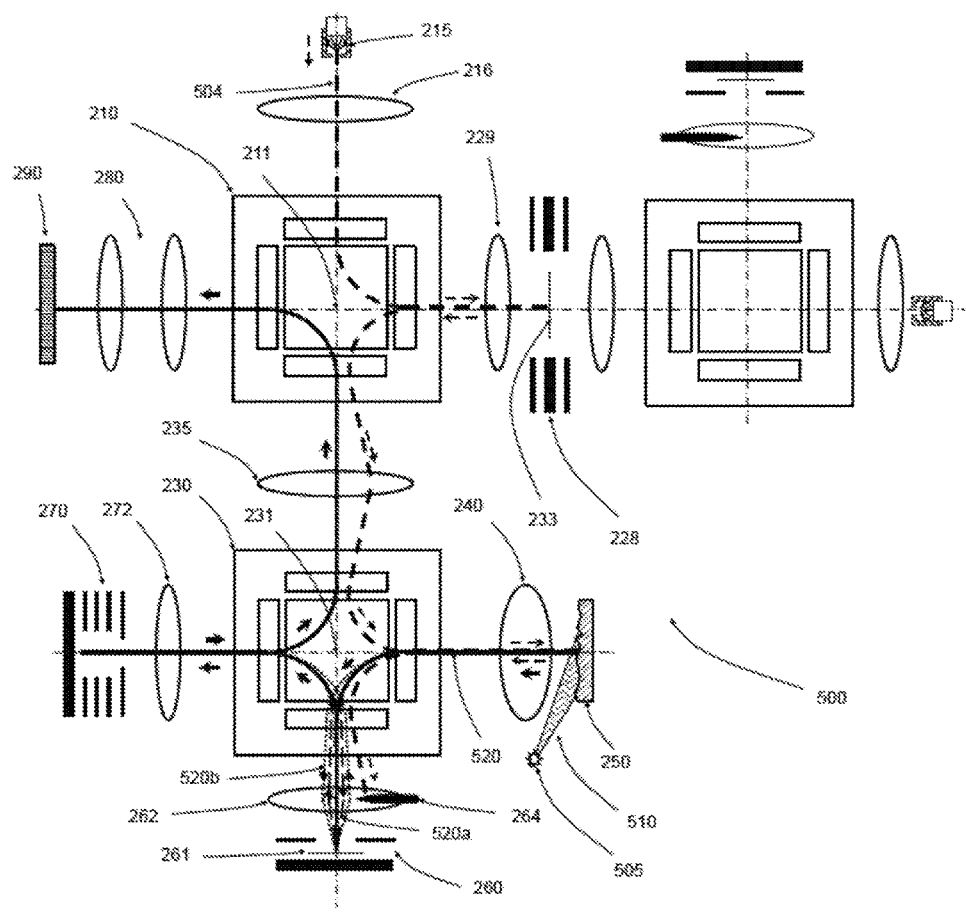
FIG. 5 is a diagram depicting a structure for a photoemission electron microscope having an aberration corrector, energy filter, monochromator and two illuminating beams in accordance with an embodiment of the invention.

FIG. 5 is a diagram depicting one implementation of the photoemission electron microscopy mode 500 utilizing apparatus 200 comprising further an X-ray or UV source 505. In this microscope 500, the flood beam of photons 510 generated by X-ray or UV source 505 illuminates specimen 250 and generates a beam of photoemission electrons 520 (solid line) with a range of kinetic energies. Photoemission electrons 520 are accelerated by cathode objective lens 240 and form a magnified image blurred by the aberrations of the cathode objective lens 240.

In this photoemission electron microscopy mode 500, the charge balance beam 504 is generated by electron source 215, biased to a potential within a few volts of the specimen 250. The charge balance beam 504 is used to mitigate charging effects caused by the X-ray or UV photon illumination 510. The illumination optics 216 collimate the charge balance beam 504 into the main beam separator 210, which deflects the beam by 90 degrees towards transfer optics 229 and Einzel lens 228. Transfer optics 229 is configured to focus the achromatic plane at the reflection surface 233 of the Einzel lens 228. The reflection is caused by the central electrode of Einzel lens 228 which is biased by a few hundred volts to kilovolts more negative than the electron source 215, and thus behaves like an electron mirror and reflects the charge balance beam electrons 504 back towards the prism separator 210. The Einzel lens 228 is configured to reflect the incoming electrons symmetrically, i.e. electrons entering at an angle with respect to the normal to the electron mirror reflection surface 233 exit the Einzel lens 228 at the same angle and symmetrically with respect to the normal to the electron mirror reflection surface 233. As the charge balance beam 504 proceeds back to the prism separator 210, the axial bundle of electron rays with energies in the range ($E_0-\Delta E$, $E_0+\Delta E$) is focused by transfer lens 229 back at the achromatic plane 211 of beam separator 210 and deflected towards toward third beam separator 230. The charge balance beam 504 has lower kinetic energy while passing through magnetic beam separator 210 when compared to photoemission electron beam 520 passing through magnetic beam separator 230 and is thus deflected by a larger angle. Transfer lens 235 focuses charge balance beam 504 emanating from achromatic plane 211 of beam separator 210 at the achromatic plane 231 of beam separator 230. This ensures that after the next 90 degree deflection by beam separator 230, the charge control beam 504 enters the objective lens 240 along its symmetry axis.

After the deflection by beam separator 210 and focusing by transfer lens 235, the charge balance beam 504 is deflected by beam separator 230 towards objective lens 240. Objective lens 240 decelerates the electrons from the transport beam energy of a few tens of keV and focuses to form a parallel flood beam illuminating a specimen 250. A fraction of the charge balance beam is absorbed and balances the charge build-up formed by the emission of photoemission electrons 520.

The photoemission electron beam 520 as well as the reflected portion of charge balance beam 504 then enter beam separator 230 and are deflected towards symmetry electron mirror 260. The strength of beam separator 230 is adjusted so that photoelectrons 520 with nominal energy $E_s$ selected for imaging are deflected by 90 degrees and enter along the axis of electron mirror 260, while photoemission electrons 520a (long dashed lines) with lower energy $E_s-\delta E_1$ are deflected by a larger angle and photoemission electrons 520b (dotted lines) with larger energy $E_s+\delta E_2$ are deflected by a slightly smaller angle, due to the energy dispersion of beam separator 230. Charge balance electrons have the lowest kinetic energy $E_{min}$ and are deflected by the largest angle. The axial bundle of electron rays with energies in the range ($E_{min}$, $E_s+\delta E_2$) appears to emanate from a point near the center plane of beam separator 230, also known as the achromatic plane 231. Transfer lens 262 is configured to focus the achromatic plane 231 at the reflection surface 261 of the electron mirror 260, which is biased more negative than specimen 250 by few hundred V to a few kV, and thus reflects the photoemission electron rays 520 back towards beam separator 230. The mirror beam 504 has much lower kinetic energy while passing through magnetic beam separator 230 and is thus deflected by a larger angle and strikes knife edge aperture 264. The charge balance beam electrons 504 as well as any electrons except a small range of selected energies near selected energy $E_s$ generated by the specimen can be stopped by a knife edge aperture 264 so as to not blur the image contrast formed by the electrons with selected energy $E_s$. Knife edge aperture 264 in combination with beam separator 230 and electron mirror 260 selects electrons with nominal energy $E_s$ for imaging and thus operates as an imaging energy filter. The nominal energy $E_s$ selected for imaging can be adjusted in the range from near 0 eV (charge balance electrons) to the maximum electron energy (corresponding to the maximum photon energy) by tuning the strength of beam separator 230. The width of the energy range (and thus the energy resolution of the final filtered image) can be selected by adjusting the position of knife edge aperture 264.

The photoemission electrons 520 include electrons with a range of energies. The energy spectrum is composed of a set of peaks which correspond to the elements present in the specimen 250, and the shape of the individual peaks is determined by the electronic and bonding states of the elements. When a single peak is used for imaging, a map of the element location on the specimen can be generated.

Electron mirror 260 is configured to reflect the incoming photoemission electrons 520 symmetrically, i.e. electrons entering at an angle with respect to the normal to the electron mirror reflection surface 261 exit the mirror at the same angle and symmetrically with respect to the normal to the electron mirror reflection surface 261 of electron mirror 260. Electron rays contained in photoemission electron beam 520 are refocused by transfer lens 262 at the achromatic plane 231 of magnetic beam separator 230 and deflected towards transfer lens 272 which focuses photoemission electron beam 520 into second electron mirror 270 that is configured as an aberration corrector. After the second deflection by beam separator 230 the energy dispersion vanishes due to the imposed symmetry, which is a prerequisite for aberration correction. It is critical to remove the energy dispersion of the beam prior to entering electron mirror 270, as otherwise combination aberrations due to the dispersion of beam separator 230 and the chromatic and spherical aberrations of the electron mirror 270 are introduced that can be larger than the original aberrations and thus preclude the desired aberration correction.

Electron mirror 270 is configured to correct for one or more aberrations of cathode objective lens 240, and reflects the photoemission electron beam 520 back towards beam separator 230. The aberration-corrected photoemission electron beam 520 is refocused by transfer lens 272 at the achromatic plane 231 of beam separator 230 and deflected towards main beam separator 210. After a third 90 degree deflection through magnetic beam separator 230, aberration-corrected photoemission electron beam 520 becomes again energy-dispersed. Transfer lens 235 focuses aberration-corrected photoemission electron beam 520 emanating from achromatic plane 231 of beam separator 230 at the achromatic plane 211 of beam separator 210. This ensures that after the next 90 degree deflection by beam separator 210 the dispersion of aberration-corrected photoemission electron beam 520 vanishes due to the imposed symmetry which is desirable for high resolution imaging in the projection optics 280.

After the final deflection by beam separator 210 the aberration-corrected photoemission electron beam 520 exiting beam separator 210 is transported into the projection optics 280 and magnified on a viewing screen 290. The detection may be performed by a CCD camera detector or other detection system.

Figure 6:
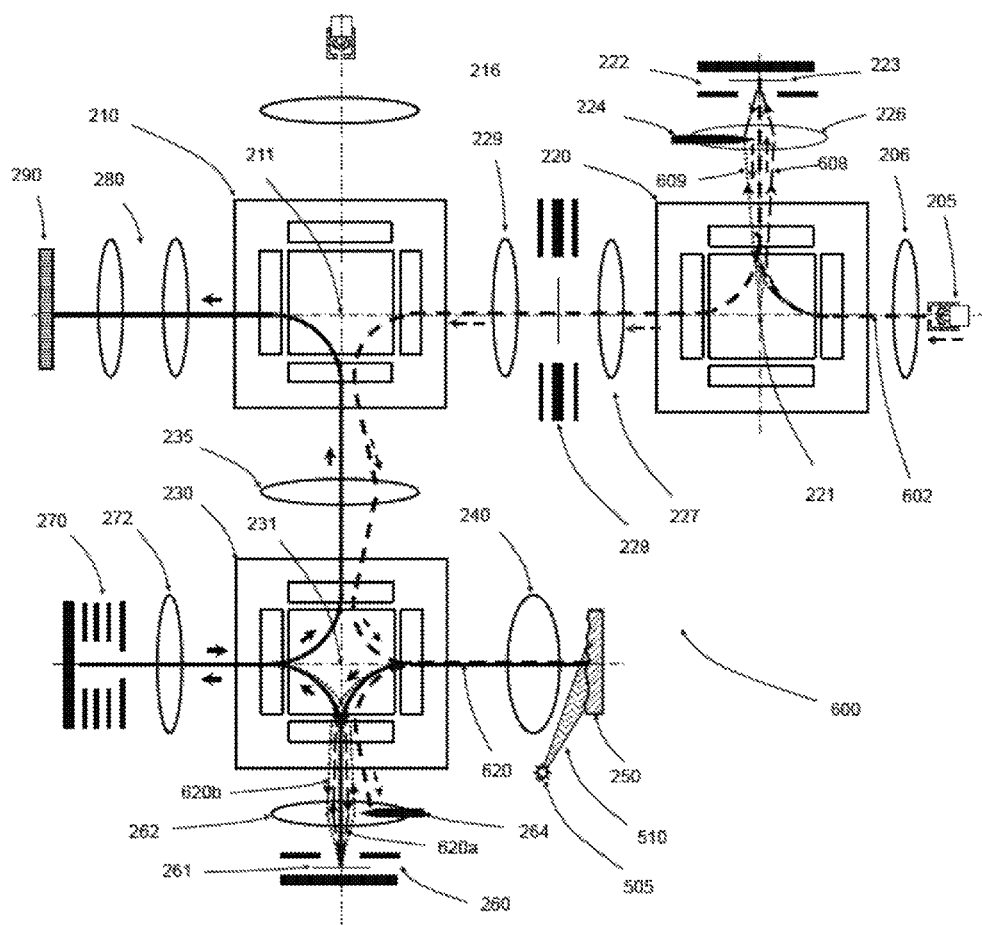
FIG. 6 is a diagram depicting another structure for a photoemission electron microscope having an aberration corrector, energy filter, monochromator and two illuminating beams in accordance with an embodiment of the invention.

FIG. 6 is a diagram depicting another implementation of a photoemission electron microscopy mode 600 utilizing apparatus 200 comprising further an X-ray or UV source 505. In this microscopy mode 600, the flood beam of photons 510 generated by X-ray or UV source 505 illuminates specimen 250 and generates a beam of photoemission electrons 620 (solid line) with a range of kinetic energies. Photoemission electrons 620 are accelerated by cathode objective lens 240 and form a magnified image blurred by the aberrations of the cathode objective lens 240.

In this photoemission electron microscopy mode 600, the charge balance beam 602 is generated by electron source 205, biased to a potential within a few volts of the specimen 250. The charge balance beam 602 is used to mitigate charging effects caused by the X-ray or UV photon illumination 510. After the illumination optics 206, the charge balance beam 602 passes through the beam separator 220, which deflects this beam into electron mirror 222. The electrons 602 with nominal beam energy $E_0$ (solid lines) are deflected by 90 degrees, while electrons 608 with slightly lower energy (long dash lines) are deflected by a slightly larger angle and electrons 609 with slightly higher energy (dotted lines) are deflected by a slightly smaller angle, due to the energy dispersion of beam separator 220. The axial bundle of rays with energies in the range $(E_0-\Delta E, E_0+\Delta E)$ exiting beam separator 220 appears to emanate from a point near the center plane of the beam separator 220, also known as its achromatic point 221 (plane). As the electrons proceed towards electron mirror 222, a knife edge-shaped aperture 224 stops one portion of the energy distribution, e.g. the higher energy electrons 609 with energies $E_0+\Delta E$. The transfer optics 226 focuses the achromatic point 221 at the reflection plane 223 of electron mirror 222, which is biased to a slightly more negative potential than the electron source 205 by a few hundred V to a few kV, and thus reflects the electrons back into the beam separator 220. As the remaining electrons proceed back to the beam separator, the lower energy electrons 608 with energies $E_0-\Delta E$ are stopped by the same knife edge-shaped aperture. The remaining nearly monochromatic electrons 602 then reenter the beam separator 220 which deflects this beam by 90 degrees back into the axis of the electron source and towards the main beam separator 210. The energy spread of charge balance beam 602 is thus significantly reduced, which is advantageous for improving the charge balance equilibrium. After the double pass through the monochromator formed by beam separator 220 and electron mirror 222, the energy dispersion of this monochromator vanishes due to the imposed mirror symmetry, which is desirable for high resolution imaging.

After exiting the beam separator 220, the nearly monochromatic charge balance beam 602 passes through transfer optics 227 and electrostatic Einzel lens 228, which in this case is turned off, i.e. all three electrodes of electrostatic Einzel lens 228 are at ground potential. The nearly monochromatic charge balance beam 602 then passes through transfer optics 229 and enters the main beam separator 210, which deflects this beam toward a third beam separator 230. After the 90 degree deflection by beam separator 230, the dispersion of charge balance beam 602 introduced by the 90 degree deflection in beam separator 230 vanishes due to the imposed symmetry which is desirable for high resolution imaging.

The charge balance beam 602 has lower kinetic energy while passing through magnetic beam separator 210 and 230 when compared to photoemission electron beam 620 passing through magnetic beam separator 230 and is thus deflected by a larger angle. Transfer lens 235 focuses charge balance beam 602 emanating from achromatic plane 211 of beam separator 210 at the achromatic plane 231 of beam separator 230. This ensures that after the next 90 degree deflection by beam separator 230, charge balance beam 602 enters the objective lens 240 along its symmetry axis.

After the deflection by beam separator 210 and focusing by transfer lens 235, the charge balance beam 602 is deflected by beam separator 230 towards objective lens 240. Objective lens 240 decelerates the electrons from the transport beam energy of a few tens of keV and focuses to form a parallel flood beam illuminating a specimen 250. A fraction of the charge balance beam is absorbed and balances the charge build-up formed by the emission of photoemission electrons 620.

The photoemission electron beam 620 as well as the reflected portion of charge balance beam 602 then enter beam separator 230 and are deflected towards symmetry electron mirror 260. The strength of beam separator 230 is adjusted so that photoemission electrons 620 with nominal energy $E_s$ selected for imaging are deflected by 90 degrees and enter along the axis of electron mirror 260, while photoemission electrons 620a (long dashed lines) with lower energy $E_s-\delta E_1$ are deflected by a larger angle and photoemission electrons 620b (dotted lines) with larger energy $E_s+\delta E_2$ are deflected by a smaller angle, due to the energy dispersion of beam separator 230. Charge balance electrons have the lowest kinetic energy $E_{min}$ and are deflected by the largest angle. The axial bundle of electron rays with energies in the range $(E_{min}, E_s+\delta E_2)$ appears to emanate from a point near the center plane of beam separator 230, also known as the achromatic plane 231. Transfer lens 262 is configured to focus the achromatic plane 231 at the reflection plane 261 of the electron mirror 260, which is biased more negative than specimen 250 by few hundred V to a few kV, and thus reflects the photoemission electron beam 620 back towards beam separator 230. The charge balance beam 602 has much lower kinetic energy while passing through magnetic beam separator 230 and is thus deflected by a larger angle and strikes knife edge aperture 264. The charge balance beam electrons 602 as well as any electrons except a small range of selected energies near selected energy $E_s$ generated by the specimen can be stopped by a knife edge aperture 264 so as to not blur the image contrast formed by the electrons with selected energy $E_s$. Knife edge aperture 264 in combination with beam separator 230 and electron mirror 260 selects photoemission electrons with nominal energy $E_s$ for imaging and thus operates as an imaging energy filter. The nominal energy $E_s$ selected for imaging can be adjusted in the range from near 0 eV (charge balance electrons) to the maximum electron energy (corresponding to the photon energy) by tuning the strength of beam separator 230. The width of the energy range (and thus the energy resolution of the final filtered image) can be selected by adjusting the position of knife edge aperture 264.

The photoemission electrons 620 include electrons with a range of energies. The energy spectrum is composed of a set of peaks which correspond to the elements present in the specimen 250, and the shape of the individual peaks is determined by the electronic and bonding states of the elements. When a single peak is used for imaging, a map of the element distribution on the specimen can be generated.

Electron mirror 260 is configured to reflect the incoming electrons symmetrically, i.e. electrons entering at an angle with respect to the normal to the electron mirror reflection surface 261 exit the mirror at the same angle and symmetrically with respect to the normal to the electron mirror reflection surface 261 of electron mirror 260. Electron rays contained in photoemission electron beam 620 are refocused by transfer lens 262 at the achromatic plane 231 of magnetic beam separator 230 and deflected towards transfer lens 272 which focuses photoemission electron beam 620 into second electron mirror 270 that is configured as an aberration corrector. After the second deflection by beam separator 230 the energy dispersion vanishes due to the imposed symmetry, which is a prerequisite for aberration correction. It is critical to remove the energy dispersion of the beam prior to entering electron mirror 270, as otherwise combination aberrations due to the dispersion of beam separator 230 and the chromatic and spherical aberrations of the electron mirror 270 are introduced that can be larger than the original aberrations and thus preclude the desired aberration correction.

Electron mirror 270 is configured to correct for one or more aberrations of cathode objective lens 240, and reflects the photoemission electron beam 620 back towards beam separator 230. The aberration-corrected photoemission electron beam 620 is refocused by transfer lens 272 at the achromatic plane 231 of beam separator 230 and deflected towards main beam separator 210. After a third 90 degree deflection through magnetic beam separator 230, aberration-corrected photoemission electron beam 620 becomes again energy-dispersed. Transfer lens 235 focuses aberration-corrected photoemission electron beam 620 emanating from achromatic plane 231 of beam separator 230 at the achromatic plane 211 of beam separator 210. This ensures that after the next 90 degree deflection by beam separator 210 the dispersion of aberration-corrected photoemission electron beam 620 vanishes due to the imposed symmetry which is desirable for high resolution imaging in the projection optics 280.

After the final deflection by beam separator 210 the aberration-corrected photoemission electron beam 620 exiting beam separator 210 is transported into the projection optics 280 and magnified on a viewing screen 290. The detection may be performed by a CCD camera detector or other detection system.

Figure 7:
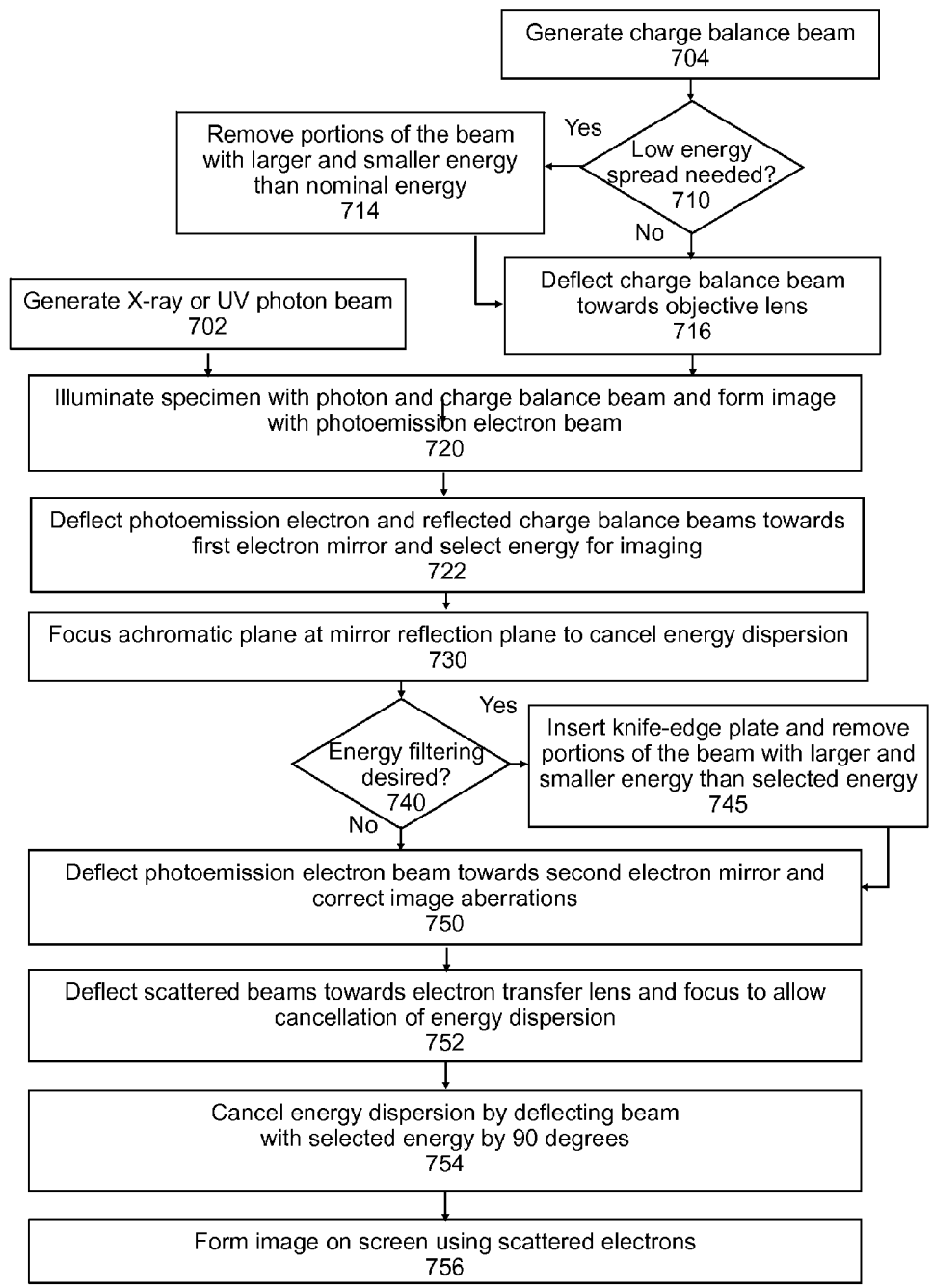
FIG. 7 is a flow chart depicting a method for imaging of a specimen using an aberration corrector, energy filter, monochromator and dual electron and photon beam illumination in accordance with an embodiment of the invention.

FIG. 7 is a flow chart depicting a method 700 for imaging of a specimen with photoemission electrons using an aberration corrector, energy filter and a charge balance electron beam in accordance with an embodiment of the invention. This method 700 may use the photoemission modes 500 and 600 utilizing structure 200 described above in relation to FIGS. 5 and 6.

A photon beam is generated 702 by a UV or X-ray source. A charge balance electron beam is generated 704 by an electron gun. When low energy spread of the charge balance beam is desired 710, the beam is passed through a monochromator which removes 714 portions of the beam with larger and smaller energy than the nominal beam energy. The charge balance electron beam is deflected 716 towards the objective lens.

Both the photon and charge balance beams illuminate 720 the specimen, and the objective lens forms an image with the photoemission electrons emitted by the specimen. The photoemission electron beam and the reflected portion of the charge balance beam are deflected 722 by a beam separator away from the illumination system and instead towards first electron mirror that in conjunction with the beam separator operates as an energy filter. The electron beam with energy $E_s$ selected for imaging is deflected by 90 degrees to introduce dispersion according to the electron energy. The beam separator deflects the high-energy component of the beam at less of an angle in comparison to its deflection of the low-energy component of the beam, such that the higher and lower energy electron-beam components exit the beam separator at different angles of trajectory. By adjusting the strength of one or more sectors in the beam separator, the selected electron energy $E_s$ can be tuned over a range of values covering the full range of the energy distribution of the photoemission electron beam emitted by the specimen.

One or more lenses are used to focus the achromatic plane of the beam separator, located near its center, at the reflection surface 730 of the electron mirror. The photoemission and charge balance electron beam are reflected in this electron mirror symmetrically, i.e. electrons entering at an angle with respect to the normal to the electron mirror reflection surface exit the mirror at the same angle and symmetrically with respect to the normal to the electron mirror reflection surface. Due to the symmetry introduced by this electron mirror, the energy dispersion introduced by the previous 90 degree deflection is canceled by the dispersion introduced by the next 90 degree deflection.

When energy filtering is desired 740, a knife-edge plate is inserted 745 between the beam separator and electron mirror into the beam path which removes one portion of the beam (either the beam with energy larger than selected energy $E_s$ or with energy lower than selected energy $E_s$) during the path towards the electron mirror. The portion of the beam except the beam with selected energy $E_s$ is removed by the same knife-edge plate during the beam path from the electron mirror towards the beam separator. When energy filtering is not needed, the knife edge aperture is removed from the beam path.

The photoemission electron beam reflected by the electron mirror is then deflected 750 by 90 degrees into a mirror aberration corrector. Due to the symmetry introduced by the electron mirror, the energy dispersion introduced by second deflection 750 cancels the dispersion introduced by first deflection 722. The dispersion-free electron beam is then reflected in the second electron mirror which is configured to correct one or more aberrations of the objective lens.

After the reflection, electrons are directed towards the magnetic beam separator and deflected 752 by 90 degrees towards the electron transfer lens. During this deflection 752, energy dispersion is introduced in the electron beam. The transfer lens is already focused 752 so that electron beams emanating from the achromatic plane of beam separator 210 are focused into the achromatic plane of the next beam separator 230. This means that transfer lens also focuses electron beam emanating from the achromatic plane of beam separator 230 into the achromatic plane of the beam separator 210. Beam separator 210 deflects the electron beam by 90 degrees 754 towards the projection optics and introduces energy dispersion which cancels the energy dispersion due to the previous 90 degree beam deflection 752 by beam separator 230. The projection optics forms 756 a magnified, aberration-corrected and energy-filtered photoemission image on a viewing screen.

CONCLUSION

A combined aberration corrector for electron lenses, electron energy filter, and monochromator with dual beam illumination comprising energy-dispersive beam separators and electron mirrors is disclosed herein. Advantageously, the above-disclosed technique allows the microscope user to simultaneously obtain aberration-corrected and energy-filtered images of specimens illuminated with two electron beams.

In accordance with certain embodiments of the invention, the aberration corrector provides the opportunity to improve the spatial resolution of images acquired by an electron microscope. Hence, more detailed information about the local structure and morphology is obtainable in electron microscopes used to characterize specimens.

In accordance with certain embodiments of the invention, the energy filter provides the opportunity to use scattered electrons with a very narrow range of energies for the formation of an image of the specimen. Hence, detailed information about the chemical composition, interatomic bonding and local electronic states is obtainable in electron microscopes used to characterize specimens.

In accordance with certain embodiments of the invention, the use of two illuminating electron beams provides the opportunity to image insulating specimens which charge up under single beam illumination. Hence, higher spatial resolution imaging is obtainable in electron microscopes used to characterize insulating specimens.

In accordance with certain embodiments of the invention, the monochromator provides the opportunity to illuminate specimens with an electron beam with a narrow energy spread, resulting in improved spatial and spectroscopic resolution. Hence, higher spatial resolution imaging is obtainable in electron microscopes used to characterize specimens.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for forming an aberration-corrected, energy-filtered image from a blurred and unfiltered image in an electron microscope, the apparatus comprising:
    a first electron beam source configured to generate a first illumination electron beam with lower energy;
    a second electron beam source configured to generate a second illumination electron beam with higher energy;
    an objective lens configured to illuminate and image a specimen;
    a first energy-dispersive device configured to:
        deflect both illumination electron beams, and
        deflect the electron beam scattered and emitted by the specimen towards an electron detector;
    a second energy-dispersive device positioned between the second electron source and first energy-dispersive device that bends the high-energy component of the electron beam at less of an angle in comparison to the bending angle of the low-energy component of the electron beam, such that the high- and low-energy electron beam components exit said second energy-dispersive device at different angles of trajectory;
    a first electron mirror configured to reflect the high electron beam exiting the second energy-dispersive device, wherein electrons entering at an angle with respect to the normal to the reflection surface of said mirror exit the mirror symmetrically with respect to said normal and at the same angle;
    a first plurality of electron lenses configured to converge at the reflection surface of the first electron mirror all energy components exiting the second energy-dispersive device at different angles of trajectory;
    a first movable knife-edge plate positioned between the second energy-dispersive device and the first electron mirror that can remove all electrons with energies higher and lower than a selected energy;
    a second electron mirror configured to reflect the electron beam scattered and emitted by the specimen, wherein electrons entering at an angle with respect to the normal to the reflection surface of said mirror exit symmetrically with respect to said normal and at the same angle;
    a third electron mirror configured to correct one or more aberrations introduced by the objective lens;
    a third energy-dispersive device configured to:
        deflect both illumination electron beams towards the objective lens and illuminate the specimen,
        deflect the electron beam scattered and emitted by the specimen towards the second electron mirror in such a manner that the high-energy component of the electron beam is deflected at less of an angle in comparison to the bending angle of the low-energy component of the electron beam and the high-energy and low-energy components exit the dispersive device at different angles of trajectory,
        deflect the electron beam reflected from said second electron mirror towards the third electron mirror in such a manner that the low-energy and high-energy components of the electron beam are rejoined and exit the dispersive device substantially along the same angle of trajectory with the energy dispersion removed, and deflect the electron beam reflected from said third electron mirror towards the first energy-dispersive device;

a second movable knife-edge plate positioned between the third energy-dispersive device and the second electron mirror that removes all electrons with energies higher and lower than a selected energy;

a second plurality of electron lenses configured to converge at the third energy-dispersive device all energy components of the electron beam exiting said first energy-dispersive device at different angles of trajectory;

a third plurality of electron lenses configured to converge at the reflection surface of the second electron mirror all energy components of the electron beam exiting said third energy-dispersive device at different angles of trajectory;

a fourth plurality of electron lenses configured to transport the electron beam exiting the third energy-dispersive device into the third electron mirror.

2. The apparatus of claim 1, wherein each energy-dispersive device deflects the electron beam by 90 degrees during each deflection step.

3. The apparatus of claim 1, wherein each energy-dispersive device is a magnetic prism composed of an array of uniform magnetic fields of different length and strength with corresponding transient magnetic fields.

4. The apparatus of claim 1, wherein the strength of said third energy-dispersive device is configured to select a specific electron energy for imaging.

5. The apparatus of claim 1, wherein the second movable knife-edge plate is removed and electrons with all energies are used for imaging.

6. The apparatus of claim 1, further comprising a light source generating photons or X-rays and configured to illuminate the specimen.

7. The apparatus of claim 1, wherein the energy-dispersive devices is are substantially identical.

8. The apparatus of claim 1, further comprising a plurality of electron lenses configured to transport the electron beam exiting the first energy-dispersive device towards the electron detector, and form a two-dimensional electron image on the electron detector.

9. The apparatus of claim 8, wherein said electron detector comprises:
an electron scintillator transforming said two-dimensional electron image into a light image; and
a light optics configured to transport said light image to an image sensor.

10. A method for forming an aberration-corrected and energy-filtered image from an unfiltered image blurred by aberrations of the objective lens in an electron microscope, the method comprising:
illuminating a specimen with a lower energy electron beam and an overlapping higher energy electron beam utilizing a first energy-dispersive device;
deflecting the higher energy electron beam at different angles of trajectory in a second energy-dispersive device towards a first electron mirror;
converging at the reflection surface of the first electron mirror all energy components of the energy-dispersed electron beam deflected at different angles of trajectory;
reflecting the electron beam in the first electron mirror such that electrons entering at an angle with respect to the normal to the mirror reflection surface exit symmetrically with respect to said normal and at the same angle;
removing all electrons with energies higher and lower than a selected energy by a first movable knife-edge plate;
generating an electron beam emitted or scattered by the specimen with a range of electron energies;
deflecting the high- and low-energy components of the electron beam generated by the specimen at different angles of trajectory in a third energy-dispersive device towards a second electron mirror;
converging at the reflection surface of the second electron mirror all energy components of the energy-dispersed electron beam deflected at different angles of trajectory;
reflecting the electron beam in the second electron mirror such that electrons entering at an angle with respect to the normal to the mirror reflection surface exit symmetrically with respect to said normal and at the same angle;
optionally removing all electrons with energies higher and lower than a selected energy by a second movable knife-edge plate;
deflecting the electron beam reflected from the second electron mirror in the third energy-dispersive device towards a third electron mirror so that the low-energy and high-energy components of the electron beam are rejoined and exit the third dispersive device substantially along the same angle of trajectory with the energy dispersion removed;
reflecting the electron beam in the third electron mirror configured to correct the objective lens aberrations;
deflecting the electron beam reflected from the third electron mirror towards the electron detector utilizing the first and third energy-dispersive devices; and
forming an aberration-corrected, energy-filtered image on the electron detector.

11. The method of claim 10, wherein the strength of the third energy-dispersive device is configured to select a specific electron energy for imaging.

12. The method of claim 10, wherein no electrons are removed and electrons with all energies are used for imaging.

13. The method of claim 10, wherein the electron beam is deflected by 90 degrees during each deflection step.

14. The method of claim 10, wherein the specimen is illuminated by photons or X-rays.

15. The method of claim 10, wherein the energy-dispersive devices are substantially identical.

* * * * *